(12) United States Patent
Hershbarger

(10) Patent No.: US 7,352,216 B2
(45) Date of Patent: Apr. 1, 2008

(54) HIGH SPEED RAMP GENERATOR

(75) Inventor: Russell Hershbarger, Nevada City, CA (US)

(73) Assignee: Teridian Semiconductor Corporation, Irvine, CA (US)

( * ) Notice: Subject to any disclaimer, the term of this patent is extended or adjusted under 35 U.S.C. 154(b) by 71 days.

(21) Appl. No.: 11/476,922

(22) Filed: Jun. 27, 2006

(65) Prior Publication Data

US 2007/0008015 A1 Jan. 11, 2007

Related U.S. Application Data

(60) Provisional application No. 60/695,241, filed on Jun. 28, 2005.

(51) Int. Cl.
*H03K 4/06* (2006.01)
(52) U.S. Cl. .................... 327/132; 327/131
(58) Field of Classification Search ........... 327/94–96, 327/131–137, 139, 140, 538–543
See application file for complete search history.

(56) References Cited

U.S. PATENT DOCUMENTS

| | | | |
|---|---|---|---|
| 5,969,513 A | | 10/1999 | Clark |
| 6,009,534 A | * | 12/1999 | Chiu et al. ............... 713/503 |
| 6,775,161 B1 | * | 8/2004 | Canova et al. ........... 363/132 |
| 6,989,694 B2 | * | 1/2006 | Garnier et al. ........... 327/142 |
| 7,271,632 B2 | * | 9/2007 | Cottin et al. ............. 327/131 |
| 2004/0183517 A1 | | 9/2004 | Reilly et al. |

* cited by examiner

*Primary Examiner*—Tuan T. Lam
*Assistant Examiner*—Patrick O'Neill
(74) *Attorney, Agent, or Firm*—The Hecker Law Group, PLC

(57) ABSTRACT

A high speed ramp generator is presented. The high speed ramp generator is advantageous over the prior art because it provides a ramp response without the delay incident with a simple integrator approach. A closed loop system generates a continuous ramp and, in an open loop manner, subtracts a mirror of the current ramp from itself. A switch is provided which when open, triggers an immediate current ramp output that is not dependent on the amplifier or any other component of prior art feedback circuits. Two such ramp generators may be used in tandem to provide alternating portions of a precision ramp signal, such as may be used to cancel the magnetization current induced in the primary of an isolation transformer.

20 Claims, 19 Drawing Sheets

HIGH SPEED RAMP GENERATOR

CROSS-REFERENCE TO RELATED APPLICATIONS

This application claims the benefit of priority from U.S. Provisional Patent Application No. 60/695,241, entitled "High Speed Ramp Generator," filed on Jun. 28, 2005, the specification of which is herein incorporated by reference in its entirety.

BACKGROUND

1. Field of the Invention

This invention relates to the field of electronics. More specifically the invention relates to a high speed ramp generator.

2. Background Art

In the prior art, ramp generators are generally closed loop integrator circuits. Because the ramp generator is an integrator with feedback, there is a time delay incident with the starting and stopping of the integrator. This time delay may not be desirable in some applications. One example of such an application is high speed data communication across an isolation barrier, as described herein.

An isolation barrier is generally used in applications in which it is desired to keep voltage potentials in one portion of a circuit isolated from voltages in another portion, e.g., to prevent relatively excessive and/or harmful voltages from entering a relatively low voltage or voltage sensitive circuit. Such applications may include, for example, telephony, medical, industrial, and other similar applications.

For example, in a telephony application, it may be necessary to protect communication circuitry from high voltages on the telephone line by placing an isolation barrier between the communication circuitry and the telephone line. However, while it is desirable to prevent harmful voltages from crossing from one side of an isolation barrier to the other, it is also desirable to facilitate signal communication between circuits on both sides of the barrier. In telephony applications, the isolation requirement is generally imposed by some governmental requirement (e.g., FCC part 68 in the US).

The transformer is one of several types of electrical devices that may be used as an element of an isolation barrier. However, in the prior art, digital communication across a transformer generally requires either a pulse transformer for each direction of communication, or time domain multiplexing of a pulse transformer (i.e., half-duplex communication). Prior art systems are incapable of full-duplex digital communication across a single transformer.

Half-duplex communication reduces communication bandwidth as each direction of communication must wait its turn to use the one-way signal channel. However, the use of multiple transformers to achieve two-way communication is expensive in terms of cost and space. A full duplex, single-transformer solution is therefore desired.

Unfortunately, the electrical characteristics of a transformer make it difficult to simultaneously drive a transmit signal onto, and detect a receive signal from, the same port of a transformer. For full-duplex signaling, it would be desirable and advantageous to have a system that can detect a receive signal across the same port of the transformer that is being used simultaneously to drive the transmit signal.

As described in the present inventor's US Patent Application 2004-0239487, entitled "Method and Apparatus for Full Duplex Signaling Across a Transformer" (incorporated herein by reference), the current into/out of the primary that is dependent upon the loading on the secondary can be separated out from the magnetizing current. By modulating the load impedance in the secondary, data can be sent from the secondary to the primary and detected from the load current on the primary side.

To separate out the load current at the primary, a corrective current signal from a ramp generator may be applied to the primary to cancel magnetizing current that the primary of the transformer might demand in such bi-directional communication across the barrier. However, the magnetizing current switches direction (i.e., ramping up or ramping down) in response to voltage transitions in the transmitted data signal (primary to secondary). Any delays in the performance of the ramp generator (e.g., onset or shut-off delays) can cause timing offsets in the corrective current signal, degrading the accurate cancellation of the magnetizing current and increasingly impacting receive data detection performance as the communication data rate rises.

As highlighted by the foregoing example, it would be desirable to have a ramp generator in which timing delays are minimized to improve performance in high-speed applications.

SUMMARY OF INVENTION

The invention provides a high speed ramp generator apparatus. The high speed ramp generator of the present invention provides an improved ramp response without the delays incident with a simple integrator approach of the prior art.

In an embodiment of the present invention, a closed loop system comprising an operational amplifier, capacitors, and resistors is used to generate a high speed ramp current output. First a constant current source is used to charge a capacitor that generates a constant slope voltage ramp. This ramp voltage is voltage-to-current converted via an operational amplifier and a resistor in a closed loop to generate a first ramp current. A second ramp current is generated by current-mirroring the first ramp current. Thus, the second ramp current tracks the first. The second ramp current is then subtracted from the first ramp current output, yielding substantially zero net output current. When the ramp output current is desired, the second ramp ceases to track the first, and instead holds a constant value. Consequently, the output current begins to ramp immediately, without undue delay.

In an embodiment of the present invention, a switch (e.g., a FET transistor) is provided which when open, turns off a current mirror loop thus freezing the second ramp current. The result is an immediate (i.e., minimal delay) current ramp output that is not dependent on the amplifier or other components like prior art feedback circuits.

one embodiment of the invention provides a method and apparatus for generation of high speed current ramp to facilitate bi-directional communication across a transformer. For instance, in one embodiment, bi-directional communication across a transformer may be accomplished by driving a first communication signal (referred to herein as "transmit data") across the transformer from a host side (e.g., the primary) to achieve communication in a first direction, and modulating the load impedance on the line side (e.g., the secondary) in accordance with a second communication signal (referred to herein as "receive data") to achieve communication in the reverse direction.

In one embodiment of the invention, the transmit data in the primary to the secondary of the transformer may be doubly DC-balanced. The current sourced by the transmit driver will consist primarily of load (across the secondary of the transformer) dependent current and magnetizing inductance current resulting from the voltage signal (i.e., transmit data) driven across the primary of the transformer. Due to the encoding, the magnetizing current exhibits a predictable return-to-zero behavior.

The magnetizing inductance current may be predicted during data transmission, based on the known transmit data, allowing the magnetizing inductance current to be modeled by alternating current ramps. An embodiment of the high speed ramp generator allows for a corrective cancellation current to be precisely applied to the primary of the transformer for accurate separation of the load current from the magnetizing inductance current at higher data rates than would be possible with ramp generators of the prior art. Receive data may be recovered by monitoring the remaining load current in the transmit driver to detect modulation of the load impedance across the secondary. Hence, full-duplex data transmission may be achieved.

DETAILED DESCRIPTION

Figure 1:
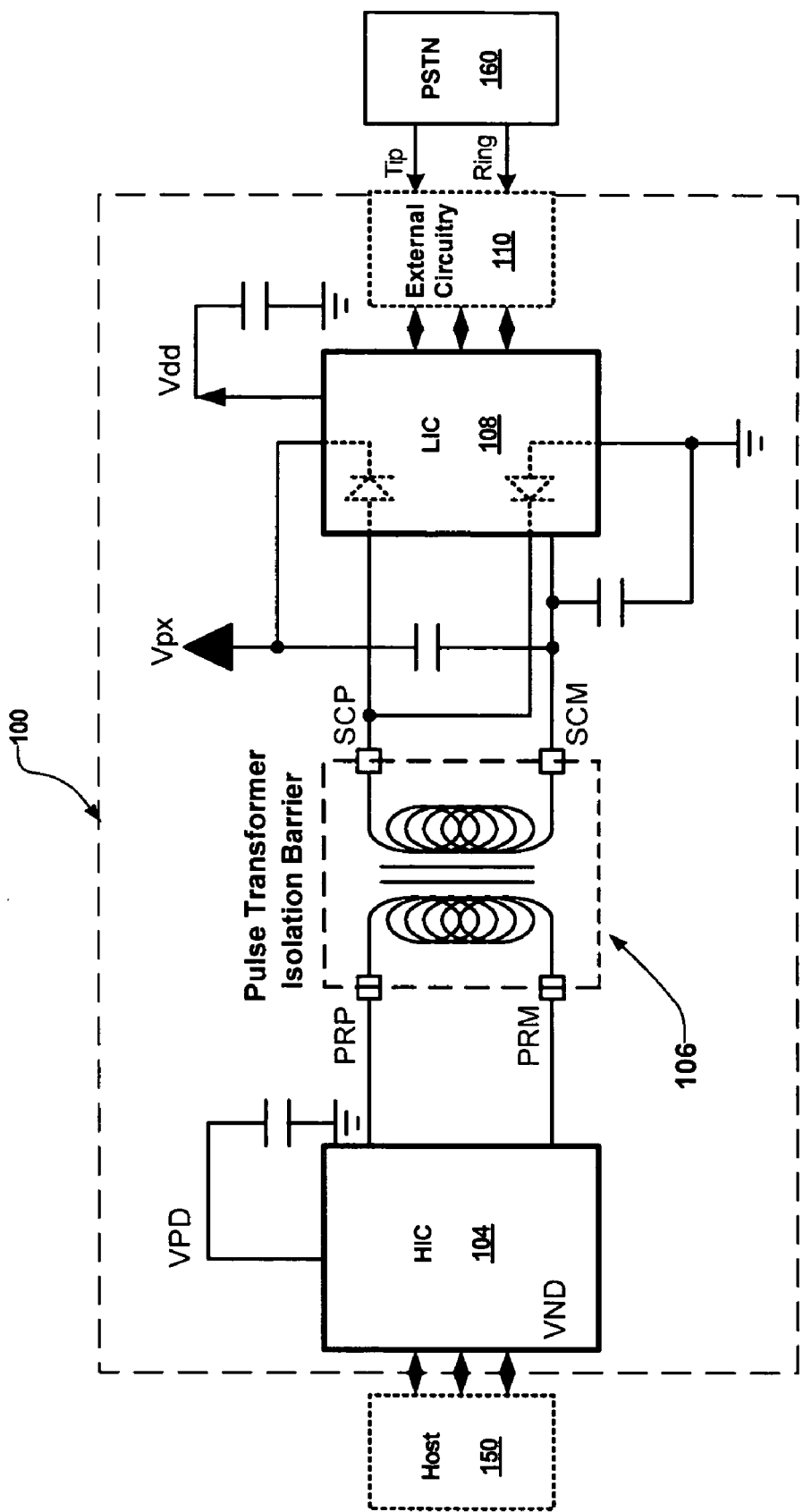
FIG. 1 is block diagram of a modern codec DAA (data access arrangement) connecting a host/DSP to a public switched telephone network in accordance with an embodiment of the present invention.

A high speed ramp generator apparatus is described. In the following description, numerous specific details are set forth to provide a more thorough description of embodiments of the invention. It will be apparent, however, to one skilled in the art that the invention may be practiced without these specific details. In other instances, well known features have not been described in detail so as not to obscure the invention.

Embodiments of the present invention use a closed loop system to generate a current ramp and then, in an open loop manner, subtract a mirror of the current ramp from itself resulting in substantially zero or constant current at the output of the apparatus. A switch on the mirror circuit may subsequently be used to effectuate an immediate ramp current at the output. For instance, a switch on the mirror loop may be configured such that when the switch opens, the output of the mirror loop freezes (i.e., no longer follows the ramp) resulting in a current ramp at the output of the apparatus with minimal onset delay. Thus, the current ramp output is not dependent on the feedback circuit and incident delays of the closed loop system, as in the prior art.

Such a high speed ramp generator may be advantageously used in many electronics applications where fast switching of a ramp current is desired. One example of such an application is a transformer-based DAA communication circuit, in which the high speed ramp generator may be used to seamlessly create current that cancels magnetization current demanded by the primary. The improved timing of the ramp generator results in more precise cancellation of magnetization current and better receive signal detection.

IMPLEMENTATION EXAMPLE

DAA Embodiment

Embodiments of the present invention may be used in communication circuits to support simultaneous, bi-directional communication across a transformer, for example, in connection with an isolation barrier of a DAA circuit. Thus, for purposes of illustration, the method and apparatus of the present invention will be described below within the context of a DAA isolation barrier implementation. Although the discussions herein are concentrated on the disclosed DAA environment, it should be apparent to those of skill in the art that the principles expounded herein are applicable to any application wherein it is desired to precisely control a ramp current, e.g., to cancel or balance the magnetizing inductance current of a transformer, or other inductive circuit or circuit component.

Signal communication across an isolation barrier is generally useful for telephony, medical, industrial, and other applications wherein it is desired to separate voltage potentials. In telephony applications, communication devices (e.g., computers, fax machines, etc.) typically connect to the PSTN (public switched telephone network) through modem devices to send and receive signals over the telephone lines.

A DAA circuit (data access arrangement) provides the interface between the modem device and the telephone lines, including the isolation barrier. The DAA may be described in terms of a "line side" (i.e., that portion of the circuitry that couples to the telephone line), a "host side" (i.e., that portion of the circuitry more closely associated with the host device; also referred to as the "modem side" or "DSP side"), and an isolation barrier that separates the line side and the host side. The isolation barrier may include one or more isolation elements, as well as one or more isolation element types (e.g., transformers, capacitors, optical couplers, etc.).

FIG. 1 is a block diagram of one embodiment of a modem DAA connecting a host/DSP to a PSTN. In this illustration, DAA 100 connects Host Computer 150 to PSTN 160 via the "tip" and "ring" lines of the telephone network. DAA 100 comprises Host Interface Component (HIC) 104; Isolation Barrier 106; Line Interface Component (LIC) 108; and external circuitry 110. HIC 104 interfaces the DAA functions with Host 150. Host 150 may include, for example, a DSP, personal computer, or similar device.

External circuitry 110 provides circuitry for connection of the DAA to PSTN 160. Typically, the PSTN signal is analog in nature. The analog information from the PSTN may be converted to digital information in LIC 108 before transmission across Isolation Barrier 106 to HIC 104. In one embodiment, Isolation Barrier 106 comprises a pulse transformer.

In telephony applications, analog voice band signals (e.g., 300 Hz-3.6 KHz) on the phone line may be converted to digital data in LIC 108 using modulation/demodulation techniques (e.g., at the rate of 1.536 Mbps for an 8 kHz sampling rate). The generated digital data may be further processed and/or directly time-division multiplexed with status and other information to form an effective transfer rate that may be higher than the bit rate of the digital data being sent across the transformer of Isolation Barrier 106. HIC 104 may subsequently demultiplex the received bit stream into the various components, e.g., voice band signal, status, and other information. HIC 104 may digitally filter the voice band signal, decimate and demodulate the voice band signal to extract the original voice band information, and then send the extracted digital voice band data (e.g., in 16-bit samples) to Host 150.

In the other direction (i.e., transmission from Host 150 to PSTN 160), HIC 104 may receive digital information from Host 150 for transmission to PSTN 160. HIC 104 may receive the digital information in the form of a digital data stream or other form (e.g., 16-bit data at 16 kHz) from Host 150 and may serialize it via a parallel-to-serial converter (or an appropriate modulation technique) to a bit stream of appropriate rate (such as, but not limited to, 256 kbps or 1.536 Mbps). In accordance with one or more embodiments of the invention, an encoding scheme may be used to maintain DC-balanced current and voltage characteristics within the signal driven across the transformer of Barrier 106, thus raising the actual data transfer rate across the barrier to the full transfer speed (such as, but not limited to, 512 kbps or 2.048 Mbps). The digital bit stream is then received by LIC 108.

Communication across Isolation Barrier 106 may be performed in full-duplex. In addition to the data communicated across the barrier, control and clocking information, as well as power may be sent across the barrier. For instance, clocking information used to reconstruct the HIC clock in LIC 108 may be embedded in the bit stream sent across the barrier from HIC 104.

In one embodiment of the DAA circuit, HIC 104 may provide power needed by LIC 108 while the phone line connection is "on-hook." However, after the phone line connection goes "off-hook," LIC 108 may be entirely line powered, if power is available from the telephone line.

A serial data port may be provided for transferring "receive" data and status information from HIC 104 to Host 150 and "transmit" data and control information from Host 150 to HIC 104. As used herein, "receive" data is data sent from the line side to the host side and "transmit" data is data sent from the host side to the line side.

In the descriptions that follow, the primary side of transformer 106 is connected to HIC 104 and the secondary side of transformer 106 is connected to the LIC 108 for consistency in description. It should be apparent to those of skill in the art that other arrangements are also possible. In addition, "forward direction" refers to data and control bits driven onto the primary by the HIC drivers. Clocking and power may also be provided in the forward direction. The "reverse direction" is data received by HIC 104 from across Barrier 106.

Pulse transformer 106 may have, for example, a 1:1 (PRI:SEC) winding ratio. However, it should be apparent to those of skill in the art that the transformer ratio is in no way constrained to those discussed herein.

The pulse transformer has advantages over other types of isolation elements. For instance, advantages of a pulse transformer over a capacitor as the isolation element include lower cost Bill of Materials (BOM); lower component count; and better common mode noise immunity. In addition, it may be easier to send power across a transformer with minimum loss (e.g., HIC 104 sending power across to LIC 108) while the phone line connection is "on-hook."

Figure 2:
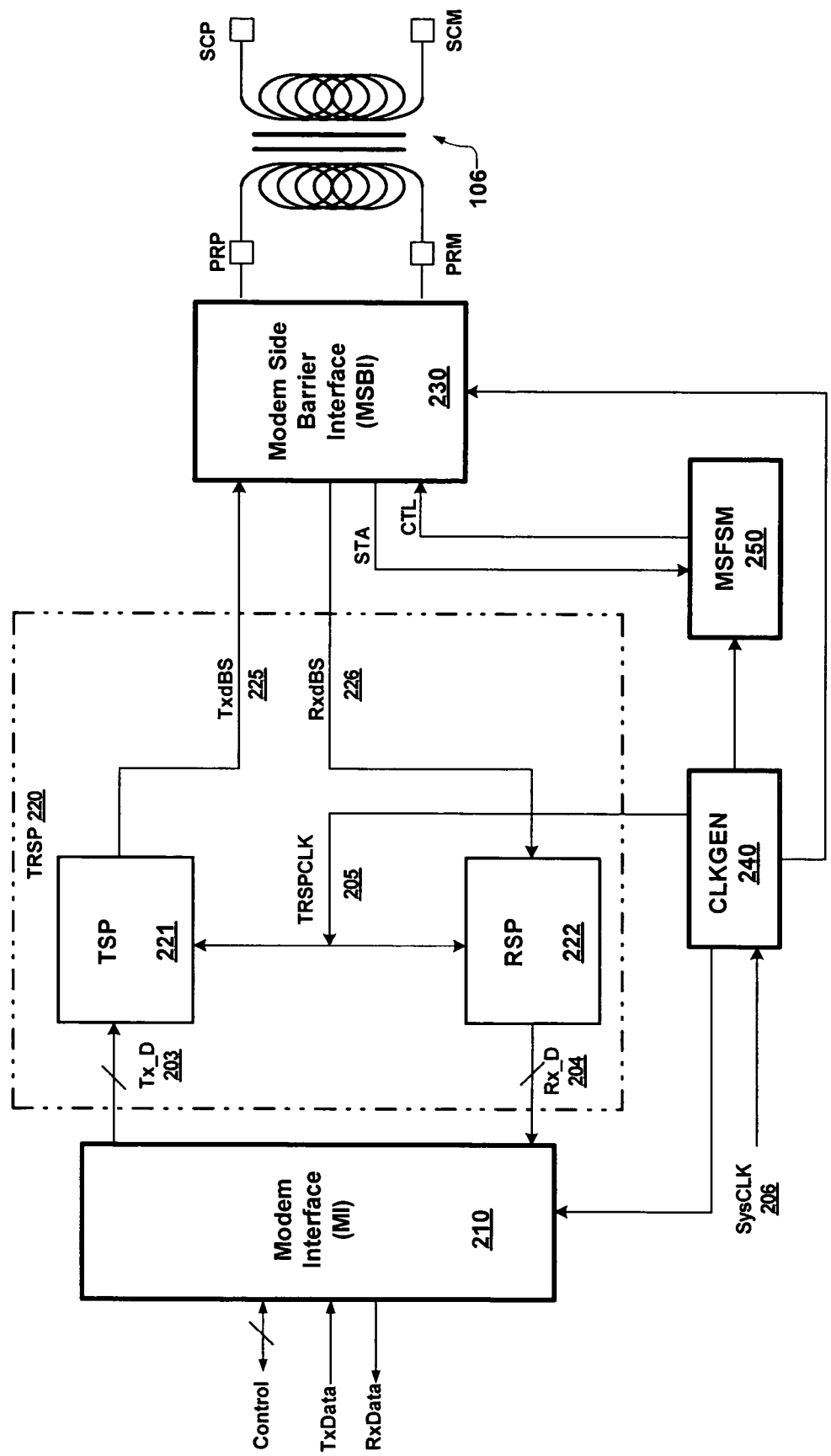
FIG. 2 is a block diagram of a host interface component in accordance with an embodiment of the present invention.

FIG. 2 is a block diagram of an embodiment of Host Interface Component 104. In the illustrated embodiment, HIC 104 may include, for example, Modem Interface (MI) 210; Transmit and Receive Signal Processors (TSP 221 and RSP 222); Modem Side Barrier Interface circuit (MSBI) 230; Modem Side Barrier Interface Finite State Machine (MSFSM) 250; and Clock Generation Circuit (CLKGEN) 240.

MI 210 may provide a bi-directional data port that can be configured to support most DSP's or similar processing units with which it may interface. MI 210 provides an interface between Host 150 and DAA 100. In the present illustration, only representative interface signals are shown.

Signals Tx_D 203 and Rx_D 204 may be configured as internal signals of a predetermined width (e.g., 16 bits wide). In this illustration, Tx_D 203 is input to Transmit Signal Processor (TSP) module 221 and Rx_D 204 is output from Receive Signal Processor (RSP) 222. In addition, clock signals TRSPCLK 205 provides clocking for module TSP 221 and module RSP 222. In addition, clocks to MSFSM 250 and MSBI 230 may be derived within CLKGEN 240 from the system clock (SysCLK 206).

TSP 221 receives digital data, Tx_D 203, from MI 210, processes the digital data, and may serialize it via a simple parallel to serial converter or through an over-sampling quantizer (e.g., digital sigma-delta modulator) to generate transmit bit stream TxdBS 225, which is coupled to MSBI 230 for transmission over the barrier. The present invention is in no way limited in the mechanism by which the one-bit data stream TxdBS originates.

In one or more embodiments, TSP 221 may consist of a transmit interpolation filter (TIF) that takes in 16-bit data, for example, from MI 210 at a certain rate (e.g., 8 kHz), and a parallel to serial converter or a digital sigma-delta modulator. The TIF may up-sample (i.e., interpolate) the data to a desired rate (e.g., 16 kHz), and output a 16-bit (or other multi-bit) data stream. This 16-bit data stream may be immediately serialized and sent to MSBI 230 for transmission or, alternately fed to a digital sigma-delta modulator and thus converted to a serialized bit stream for transmission. The former has the advantage of reduced data rate across the barrier; however, any serialization method may be employed without departing from the spirit of the invention.

The serialized output TxdBS 225 from either the parallel to serial converter or a digital sigma-delta modulator (DSDM) is fed into MSBI 230 for time-division multiplexing with control data to form a transmit bit stream (TBS), which, in one or more embodiments, is double-balanced encoded (e.g., DC-balanced with respect to current and voltage drive to the transformer) prior to transmission across the barrier to LIC 108.

In the receive direction, information that is transferred over the barrier (e.g., using impedance modulation) from the LIC 108 to MSBI 230 is decoded and separated into data and status in MSBI 230. The data portion (RxdBS 226) may be fed to RSP 222 for further signal processing.

The output of RSP 222, Rx_D 204, may be decimated output data (e.g. 16-bit wide) at the desired rate (e.g., 8 kHz). Rx_D 204 may then be transmitted to MI 210 for subsequent processing and transmission to Host 150.

MSBI 230 provides the interface functionality of the HIC with the isolation barrier for communication with LIC 108. In one or more embodiments, in addition to other functions, the MSBI 230 may manage all of the required signaling across the barrier by, for example: encoding the transmit bit stream (TxdBS 225) and control information (CTL) and transferring the encoded signal across the barrier; decoding the receive bit stream (RxdBS 226) and status information (STA) from LIC 108; and generating proper amplitude pulses to transfer power to LIC 108 when necessary. The MSFSM 250 is a state machine that controls the functions of MSBI 230 and generates the control signal, CTL, that is transferred across the barrier to LIC 108.

Figure 9:
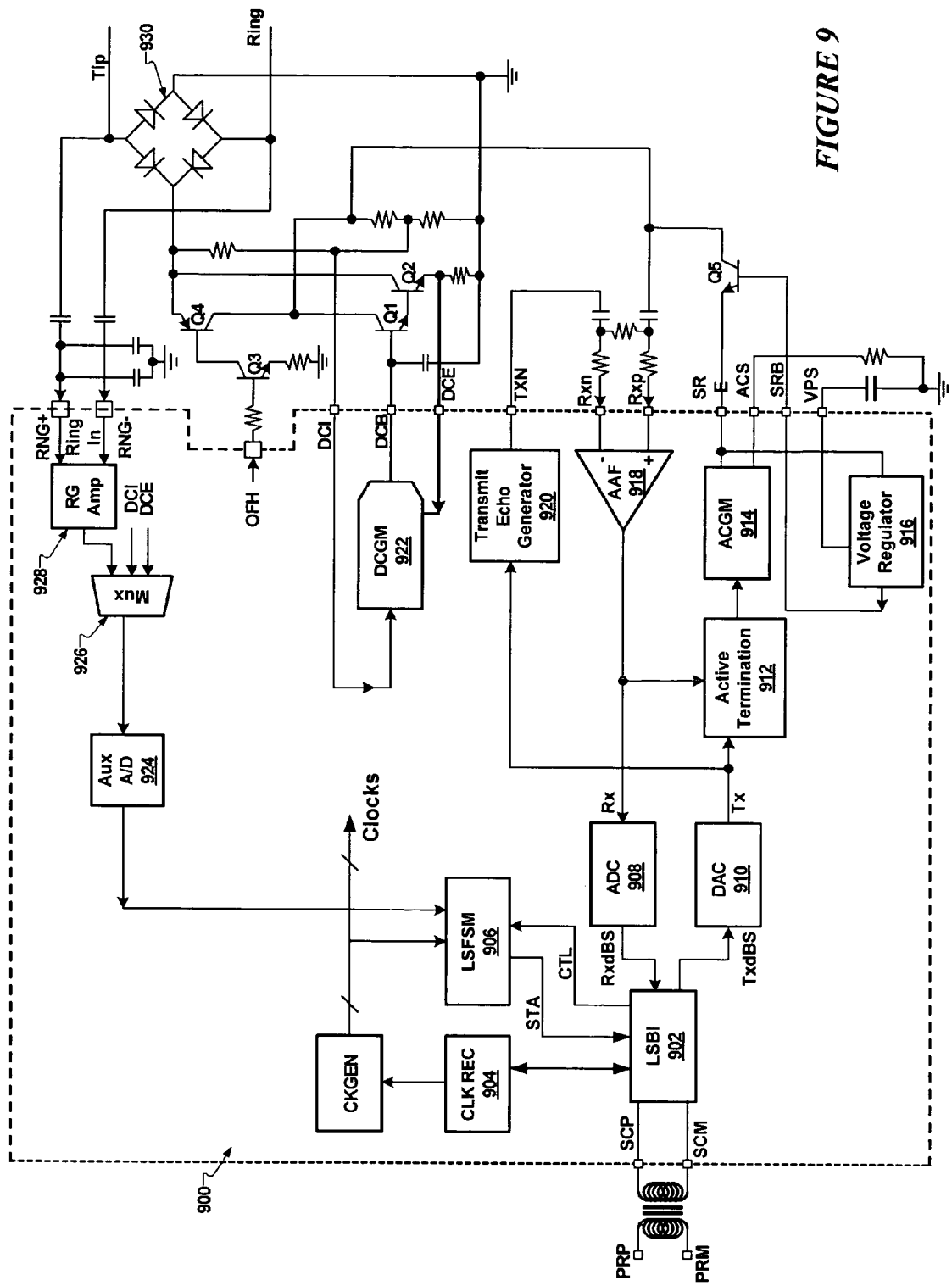
FIG. 9 is a block diagram of a line interface component in accordance with an embodiment of the present invention.

Referring back to FIG. 1, the telephone line side of the DAA embodiment comprises LIC 108 and external circuitry 110. The functionality of LIC 108 and external circuitry 110 of one possible embodiment are further illustrated in FIG. 9. As illustrated, LIC 108 comprises circuitry enclosed in block 900. Other circuitry (not shown) may also be part of the external circuitry 110.

LIC 108 comprises Line Side Barrier Interface (LSBI) 902; Clock Recovery circuit (CLK REC) 904; Line Side Finite State Machine (LSFSM) 906; Analog-to-Digital Converter block (ADC) 908; Digital-to-Analog Converter block (DAC) 910; Active Termination circuit 912; AC Transmit Driver (ACGM) 914; Voltage Regulator 916; Anti-Aliasing Filter (AAF) 918; Transmit Echo Generator 920; DC Termination Circuit (DCGM) 922; Auxiliary Analog-to-Digital Converter (Aux A/D) 924; Multiplexer 926; and Ring Amplifier (RG Amp) 928.

In one embodiment, the analog signal from the telephone line (Tip and Ring) is conditioned through Rectifier 930 to eliminate any polarity issues. The positive terminal of Rectifier 930 is AC coupled through the Rxp input of block 900 to the positive terminal of AAF 918. The negative terminal, Rxn, of AAF 918 is AC coupled to output TXN of Transmit Echo Generator 920 for transmit echo cancellation. AAF 918 sums the receive signal, Rxp, with a portion of transmit signal, TXN, to reduce the transmit signal component in the receive path.

The analog output, Rx, of AAF 918 is coupled to ADC 908 for conversion to the receive data bit stream, RxdBS. The resulting high frequency one-bit receive data stream (RxdBS) may be sent to LSBI 902 for encoding and eventual transmission across the barrier to HIC 104, or alternately be further filtered by an additional digital filter such as Sinc^3 filter, then serialized and sent to LSBI 902 for transmission across the barrier.

DCGM 922 provides for appropriate DC termination characteristics by monitoring the input voltage from the telephone line (DCI), and the DC loop current sense (DCE).

On the transmit side, the transmit bit stream (TBS) received from across the barrier by LSBI 902 is first separated into transmit data bit stream (TxdBS) and control data (CTL). TxdBS is processed through Digital-to-Analog Converter block (DAC) 910 to generate the analog transmit signal Tx. The received signal from AAF 918 (e.g., Rx) is summed with the transmit signal in Active Termination block 912. AC termination is provided by sensing the receive signal at Rxp and feeding back an appropriate AC current generated within Active Termination Circuit 912 via AC Transmit Driver 914 to the collector of transistor Q5.

In one or more embodiments, an auxiliary analog to digital converter, Aux A/D 924, may be used to convey status information associated with the line condition. The tip and ring inputs may be coupled as differential inputs to amplifier 928, and then multiplexed with the line sensing signals, DCI and DCE, for conversion in Aux A/D 924. The output of Aux A/D 924 may then be coupled to Line Side Finite State Machine (LSFSM) 906 for transmission to HIC 104 as a status (STA) component of the receive signal. The host (i.e., Host 150) in communication with HIC 104 receives and interprets the status data to decide the appropriate action in controlling the DAA device.

Full-Duplex Signaling Over the Transformer

To understand the functions of MSBI 230 and LSBI 902, it is useful to discuss the general concept of transferring data bi-directionally and simultaneously (i.e., full duplex) across the isolation barrier in accordance with one or more embodiments of the present invention.

Figure 3A:
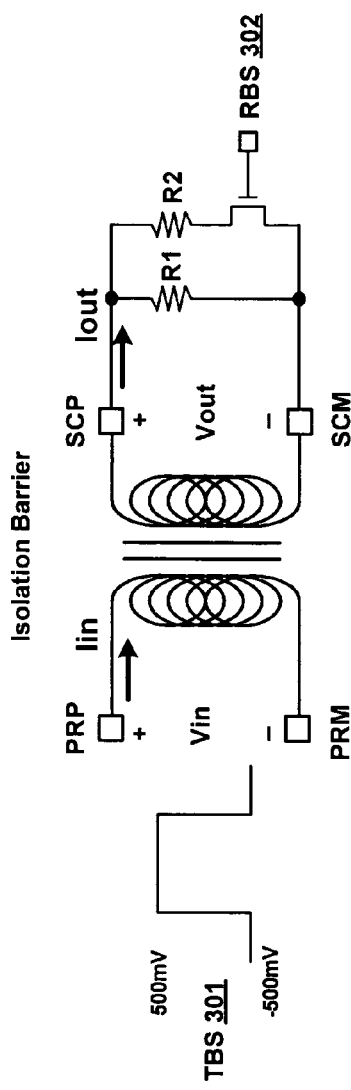
FIG. 3A is a circuit diagram of a transformer drive scheme in accordance with an embodiment of the present invention.
Figure 3B:
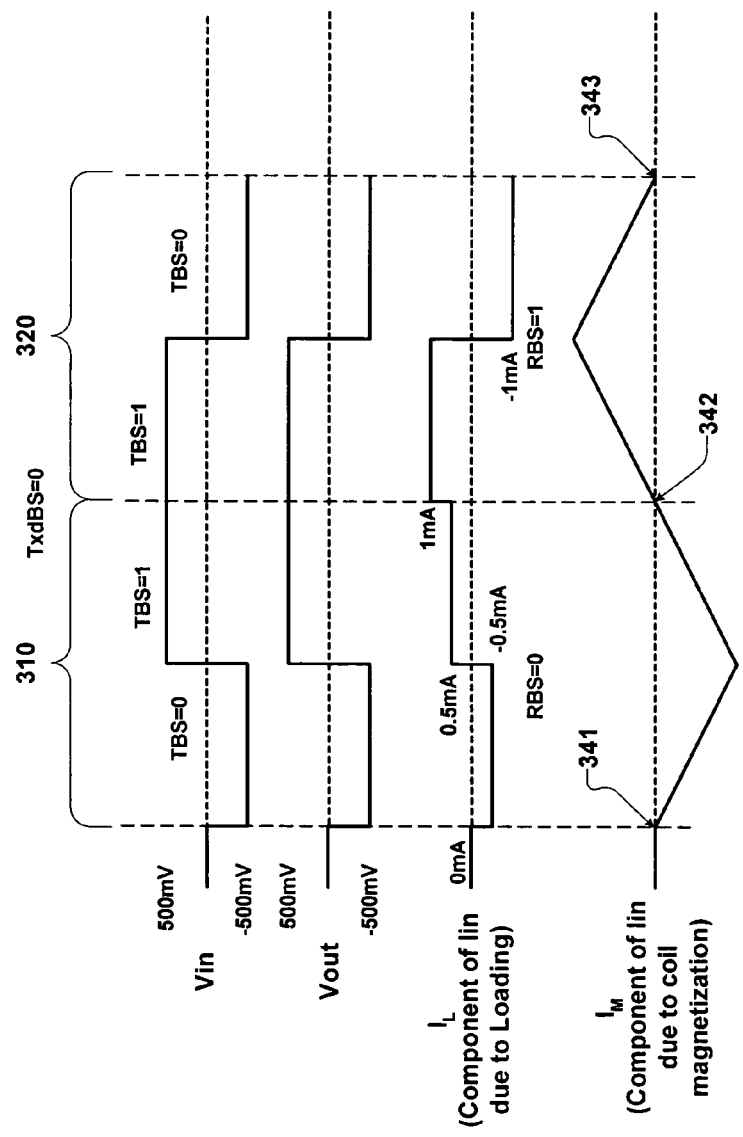
FIG. 3B is a signal diagram of the circuit of FIG. 3A, in accordance with an embodiment of the present invention.

FIGS. 3A and 3B provide illustration of the basic concept involved in the bi-directional transfer of data across a pulse transformer. FIG. 3A is an illustration of a transformer drive scheme in accordance with an embodiment of the present invention. FIG. 3B shows the transformer voltage and current values Vin, Vout, and Iin when the input data TxdBS=0 is doubly DC balanced via Manchester coding to yield 0110 and the receive data RBS is altered from 0 to 1 at mid point of the data period. In this illustration, PRP and PRM are the positive and negative terminals on the primary side of the pulse transformer, respectively. Similarly, SCP and SCM are the positive and negative terminals on the secondary side of the pulse transformer, respectively.

In operation, transmit data, in the form of input voltage Vin, is driven across the primary side of the transformer. Assuming a 1:1 winding ratio (though other winding ratios may be used as well), mutual inductance causes the input voltage to be induced across the output terminals of the secondary as Vout. As a consequence, output current Iout flows through the loading resistor R1 (e.g., 1 k□), assuming the switch on R2 is open (i.e., off). Since magnetic flux in a transformer cannot change immediately, input current Iin will flow into the primary side simultaneously.

By turning on the switch controlled by RBS 302 (see portion of waveforms in FIG. 3B labeled 320), and hence placing resistor R2 in parallel with resistor R1, the load impedance changes to the equivalent impedance of two resistors in parallel. For example, if R1 and R2 are each 1 k□, then the equivalent impedance is 0.5 k□. Load-dependent components of Iout and Iin also change as the impedance changes. For instance, if the load current, $I_L$, is 0.5 milliamps when driven by +0.5 v across the primary ports with only R1 as the load impedance, then the load current will double to 1.0 milliamps when R2 is switched on (given R1=R2=1 k□). Thus, if the load-dependent portion of Iin could be separated out from the total current Iin, it would form a basis for detecting the impedance changes on the primary side of the barrier and extracting the receive data (RBS 302) responsible for those changes (i.e., by controlling the switch).

In operation, Iin is composed of a magnetizing inductance component and a load current component. For the detection of impedance modulation, it is possible to isolate the component of Iin due to load impedance, $I_L$, from the component of Iin due to the magnetizing inductance, $I_M$. One or more embodiments of the invention facilitate isolation of the loading current from the magnetizing current by using a transmit data encoding scheme that is double DC balanced, i.e., DC balanced in both current and voltage. Double DC-balancing of the transmission signal induces predictable behavior in the magnetizing inductance current, such that the magnetizing inductance current is near zero at specific times. For example, in FIG. 3B, $I_M$ approaches zero value at points 341, 342 and 343 (e.g., at the end of each double-balanced data period).

Figure 4:
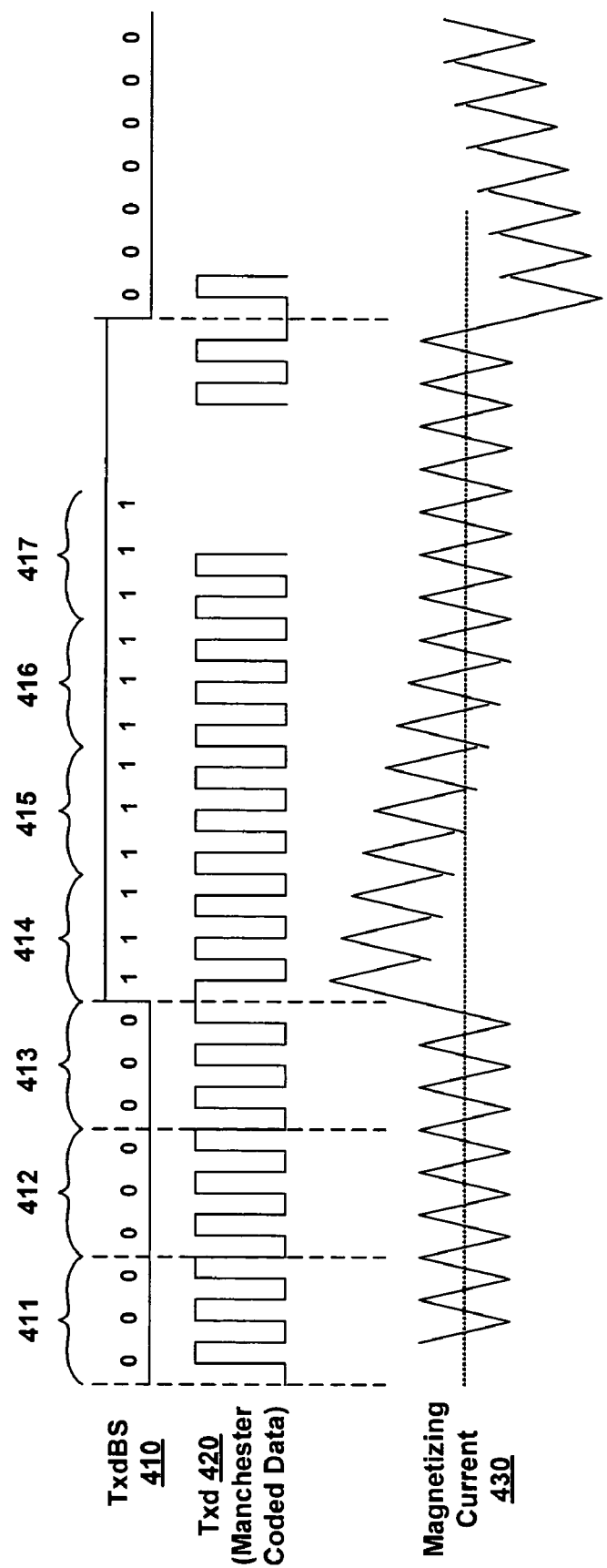
FIG. 4 is a signal diagram illustrating the effect of a single-balanced data signal (e.g., by 1-bit to 2-bit Manchester encoder) on magnetizing current.

FIG. 4 provides an example of a transmit data stream that is not double-balanced, with the corresponding magnetizing current. In this example, transmit data TxdBS 410 is Manchester encoded (single balanced) to generate coded data Txd 420, which is driven across a transformer. In this illustration, the magnetizing current 430 at the end of each of the Manchester periods is affected by the change in data pattern and may vary from one Manchester period to the next as shown. For example, at the transition from data sequence 413 to data sequence 414, the magnetizing current, because of its integrating behavior, rises well above the DC balance point for current. The perturbation in DC current value decays toward zero over time until perturbed again by another non-double-balanced data sequence. This makes the process of isolating the load current from magnetizing current more difficult because the value of the magnetizing current is unpredictable.

To make magnetizing current predictable, the transmit signal may be doubly DC balanced prior to transmission across the transformer. Balancing the transmit data signal in both current and voltage may be established, for example, by applying multiple single-balanced encoding processes to the transmit data (in sequence or otherwise). For example, Manchester encoding (i.e., 1b/2b) applied twice to the transmit signal will result in a double-balanced data stream. In other embodiments, a single encoding process may be implemented that provides DC balancing of both current and voltage characteristics. The benefit of this encoding is that the magnetizing current, $I_M$, returns to zero at the end of every Manchester period.

In accordance with one embodiment of the invention, this facilitates detection of the load current, $I_L$, by sampling Iin at specific points in time when $I_M$ is near zero (e.g., near the transition between each Manchester period).

In accordance with another embodiment of the invention, the predictable nature of magnetizing current $I_M$ allows for generation of a corresponding cancellation current at the primary of the transformer, such that the load-dependent current $I_L$ may be sampled substantially free of the influence of the magnetizing inductance current.

The impact of specific balancing block codes on transmission bandwidth, circuit complexity, and decay time of the encoded signal may be considered in selecting a particular encoding scheme. For instance, using two Manchester encoders (1-bit to 2-bit encoding) in series would result in the use of four times the original transmission bandwidth. In contrast, using a 7b/8b (i.e., 7-bit to 8-bit) encoder would be more bandwidth efficient, but may result in an unnecessarily complex circuit. In one or more embodiments of the present invention, a DC balanced 3b/4b encoder or a Manchester encoder is applied in series with another Manchester encoder to provide predictable magnetizing current with relatively moderate increases in bandwidth.

Figure 5A:
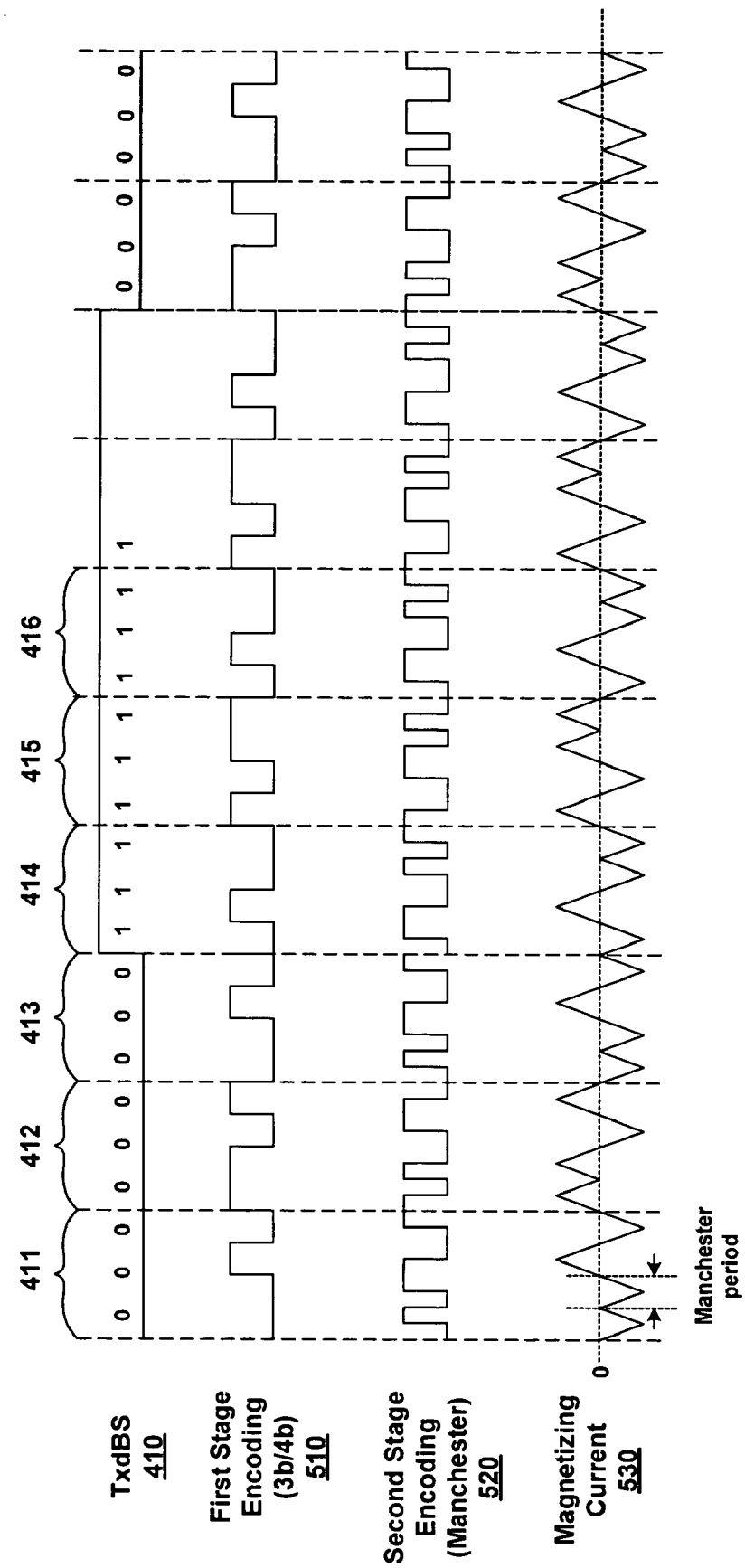
FIG. 5A is a signal diagram illustrating the behavior of the magnetizing current after transmit data is first processed through a 3-bit to 4-bit encoder followed by a Manchester encoder in accordance with an embodiment of the present invention.

FIG. 5A is an illustration of the behavior of the magnetizing current after TxdBS 410 is processed through a 3-bit to 4-bit encoder in accordance with an embodiment of the present invention. In this illustration, a DC-balanced 3-bit to 4-bit encoding scheme is used in the first stage (i.e., waveform 510), followed by a Manchester encoding second stage (i.e., waveform 520). This combination of encoding schemes results in the magnetizing current shown in waveform 530, which returns to zero at the end of each Manchester period.

A 4-bit data scheme has only six code words available that are DC balanced as follows: "0011"; "0101"; "0110"; "1001"; "1010"; and "1100". Thus, in the 3-bit to 4-bit encoding scheme of an embodiment of the present invention, these six balanced code words are assigned the values from one ("001") through six ("110") of the three input bit combinations. The remaining two input words, zero ("000") and seven ("111") are encoded to alternate between two unbalanced 4 bit words that average to DC-balanced words, e.g., "000" may be encoded to alternate between "0010" and "1101", while "111" may be encoded to alternate between "0100" and "1011".

Figure 5B:
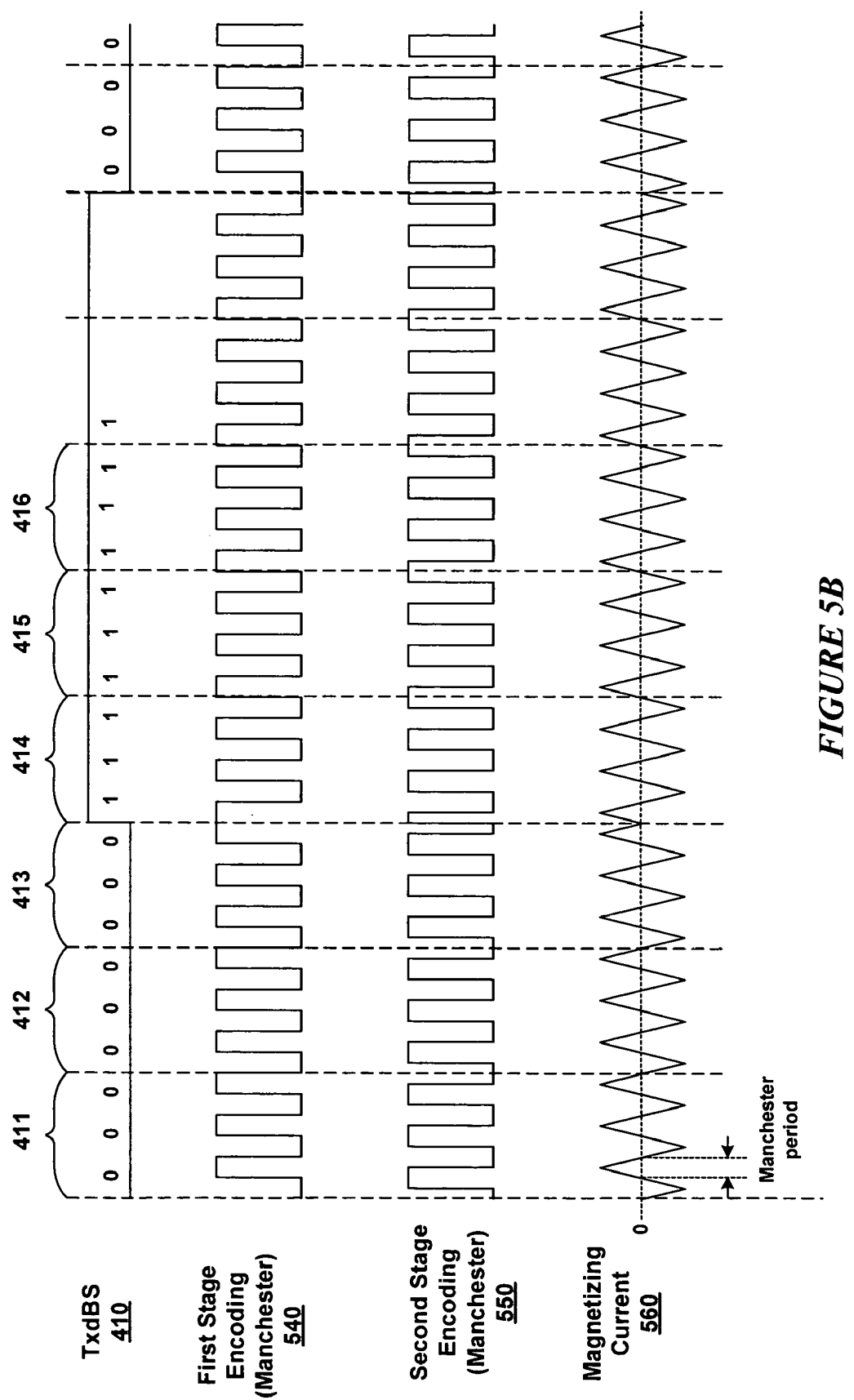
FIG. 5B is a signal diagram illustrating the behavior of the magnetizing current after transmit data is first processed through a first Manchester encoder (1b/2b) followed by a second Manchester encoder in accordance with an embodiment of the present invention.

FIG. 5B is an illustration of the behavior of the magnetizing current in another embodiment after TxdBS 410 is processed through two layers of Manchester encoding. In this illustration, a DC-balanced 1-bit to 2-bit encoding scheme is used in the first stage (see waveform 540), followed by a Manchester second stage (see waveform 550). As in the 3b/4b case, the magnetizing current is predictably zero at the end of each Manchester period independent of the raw transmit data values, as shown in waveform 560.

As waveform 530 illustrates, the encoding of each three-bit group (411, 412, 413, 414, 415, and 416) of transmit data to a DC balanced four bits results in a balanced and predictable magnetizing current 530—i.e., zero at the end of each Manchester period. Thus, the transformer input current Iin sampled at the end of every Manchester period will ideally be equal to $I_L$, the load current. Because load current can be detected by sampling the primary side current, Iin, at prescribed times, it is possible, in one or more embodiments of the invention, to communicate receive data using modulation of load impedance on the secondary of the transformer.

Modem Side Barrier Interface

Figure 6:
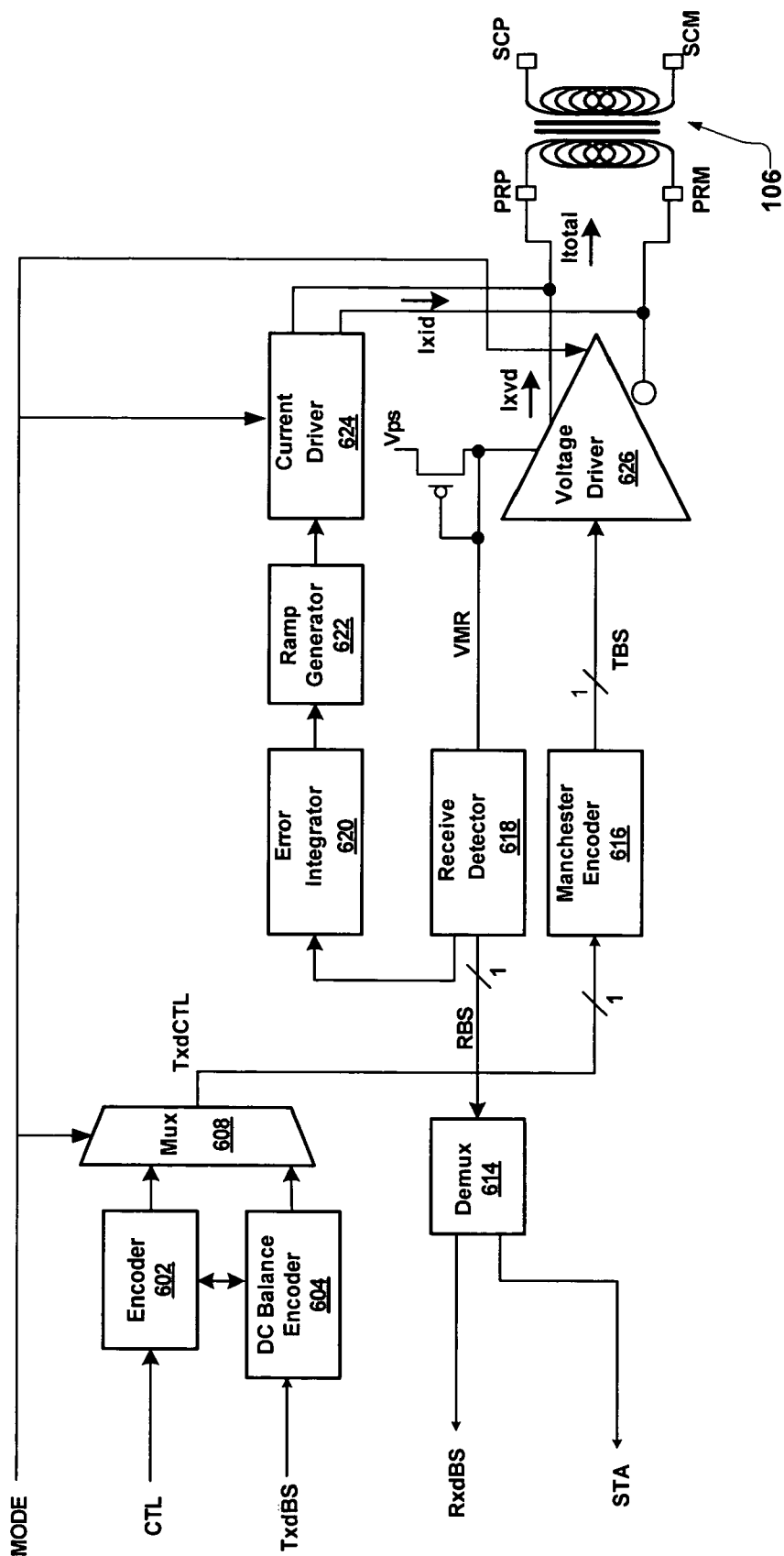
FIG. 6 is block diagram of a host-side barrier interface in accordance with an embodiment of the present invention.

Now referring back to MSBI 230 of the DAA circuit example, FIG. 6 illustrates one embodiment of a Modem Side Barrier Interface. As shown, MSBI 230 may comprise Control Encoder block 602; DC Balance Encoder block (e.g., 3b/4b, Manchester, etc.) 604; Multiplexer (Mux) 608; Demultiplexer (Demux) 614; Manchester Encoder 616; Receive Detector 618; Error Integrator 620; Ramp Generator 622; Current Driver 624; and Voltage Driver 626.

In this example, transmit data, TxdBS, is first DC-balance encoded (e.g. by either 3b/4b encoding and then serializing, or directly serializing via Manchester encoder) at block 604. Encoding increases the rate of the transmit data. For example, assuming the data rate of the transmit bit stream, TxdBS, is at 256 kbps, the actual data rate across the barrier, after two layers of Manchester encoding, is 256×4=1.024 Mbps, or after 3-bit to 4-bit conversion in series with Manchester encoding, 256×4/3×2=683 kbps.

In one embodiment, an AC power signal may be transmitted over the isolation barrier to LIC 108 from HIC 104 in special power frames that are time division multiplexed with data frames carrying the TxdBS data stream. The power frame may consist of, for example, enhanced magnitude voltage pulses that may be rectified and converted to a DC power source on the line side of the barrier. The power signal is doubly DC balanced at the point it is driven across the transformer, and, in one or more embodiments, may be utilized as a channel for control information.

In the embodiment of FIG. 6, composite signal CTL is the power signal modulated by control data. For example, when transfer of control data is necessary, the control data bit (i.e., CTL) may be encoded as follows: "0" may be encoded as "xx0101xx" and "1" may be encoded as "xx1010xx" in block 602, for example. The resulting encoded CTL data and TxdBS data are time-division multiplexed in Mux 608 to generate TxdCTL, which is subsequently Manchester encoded in block 616 to generate the transmit bit stream, TBS. Transmit bit stream TBS is driven across the barrier by Voltage Driver 626.

Figure 7A:
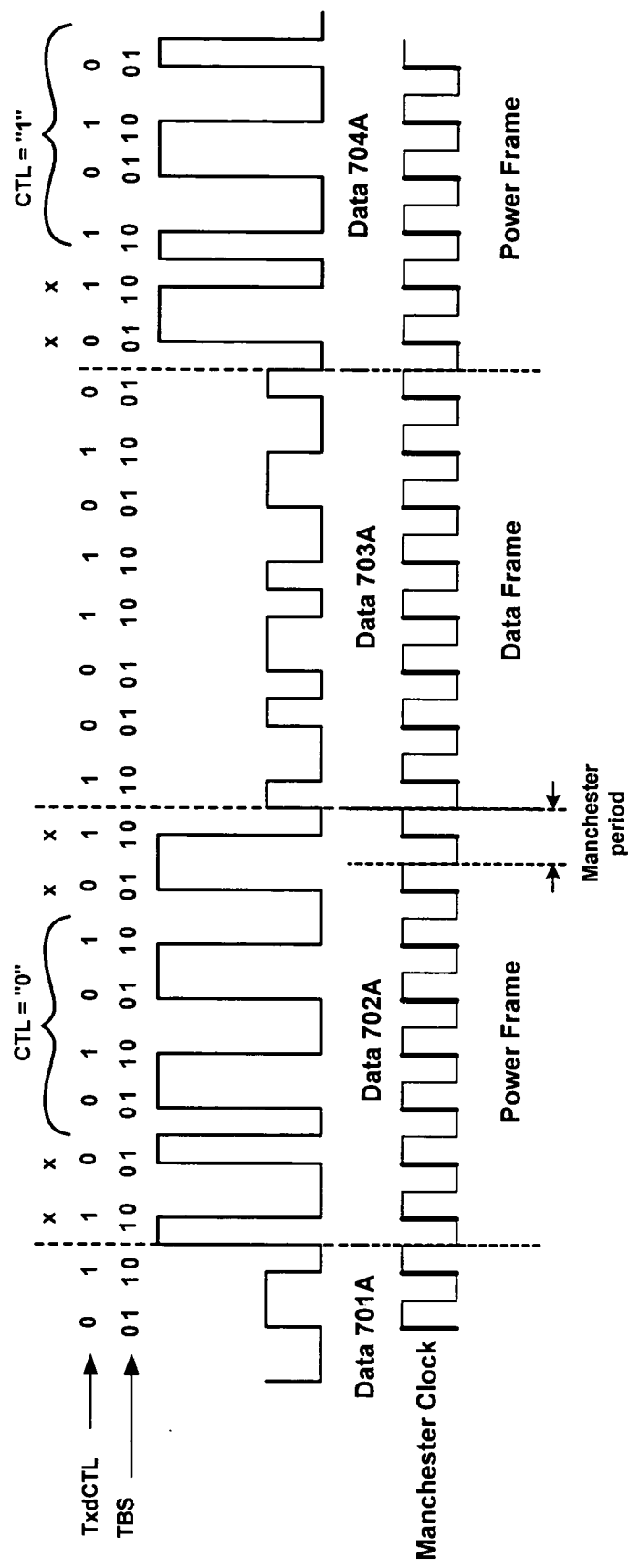
FIG. 7A is a signal diagram illustrating encoding of control and data in accordance with an embodiment of the present invention.

FIG. 7A is an illustration of encoding control and transmit data as seen across the primary side of the barrier in accordance with an embodiment of the present invention. It consists of power frames (702A and 704A) and data frames (701A and 703A). In the illustrated embodiment, each frame consists of eight Manchester periods. Each frame is thus capable of transferring four bits of raw data or eight bits of DC-balanced data (as a result of 1b/2b Manchester encoder or a 3b/4b encoder), prior to Manchester Encoder 616.

Control signal, CTL, may be time-division-multiplexed with the transmit bit stream (TxdBS) for transmission across the barrier to LIC 108 from the HIC 104. In a preferred embodiment, each power frame is assigned one value of CTL bit as shown in FIG. 7A. In block 602, CTL="0" may be encoded as "xx0101xx" and CTL="1" may be encoded as "xx1010xx". It should be clear to those skilled in the art that more than a single bit of CTL information may be transferred across in one power frame. The resulting encoded CTL data and TxdBS data are time-division multiplexed in Mux 608 to form the composite bit stream, TxdCTL, which is subsequently Manchester encoded in block 616 before being driven across the barrier by Voltage Driver 626. As illustrated, Data 701A represents data to be transmitted; Data 702A represents a control value of "0"; Data 703A represents data to be transmitted; and Data 704A represents a control value of "1".

As illustrated in FIG. 7A, for an embodiment using a 3b/4b encoder, one bit of control data and six raw (uncoded) transmit bits (equivalent to eight coded bits) are alternately transferred across the barrier, the effective control data transfer rate is one-sixth the rate of the transmit bit rate. In another embodiment wherein the first stage encoder is a 1b/2b encoder, one bit of control data and four raw (uncoded) transmit bits (equivalent to eight coded bits) are alternately transferred across the barrier, the effective control data transfer rate is one-fourth the rate of the transmit bit rate.

Figure 7B:
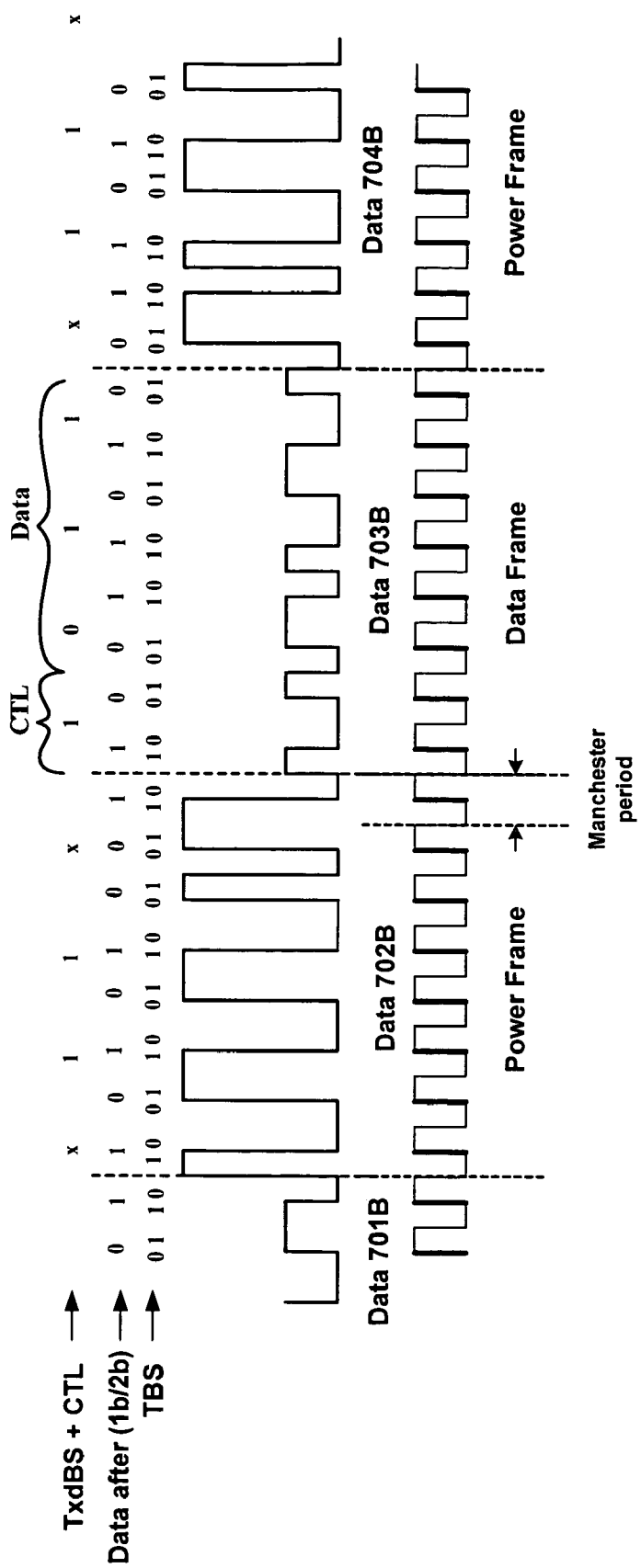
FIG. 7B is a signal diagram illustrating encoding of control and data in accordance with another embodiment of the present invention.

Alternately, FIG. 7B shows that CTL information can be embedded in the Data frame itself instead of the power frames if excess bandwidth exists within the data frames. In this embodiment, 1b/2b encoder as the first layer of encoding is used in which one bit of control data and three (uncoded) bits are alternately transferred across the barrier. The effective control data transfer rate is one third the rate of the transmit bit rate.

Cancellation of Magnetizing Inductance Current

Referring back to FIG. 6, the receive data, RBS, may be decoded by isolating the transformer current, Itotal, into two components: $I_M$, the magnetizing current; and $I_L$, the load current (i.e., due to the transformer load impedance of R1 and R2). In accordance with an embodiment of the invention, a current feedback path comprising elements 618, 620, 622 and 624 may be implemented to generate a compensating current Ixid, which acts to cancel the magnetizing inductance current, $I_M$. The feedback loop forces Ixid to track $I_M$ so that the receive data may be detected and extracted from the load current $I_L$, which in this embodiment is sourced from (or sunk by) the voltage driver as input current Ixvd (i.e., if Ixid is substantially equivalent to $I_M$, then Ixvd will consist substantially of $I_L$).

Figure 8:
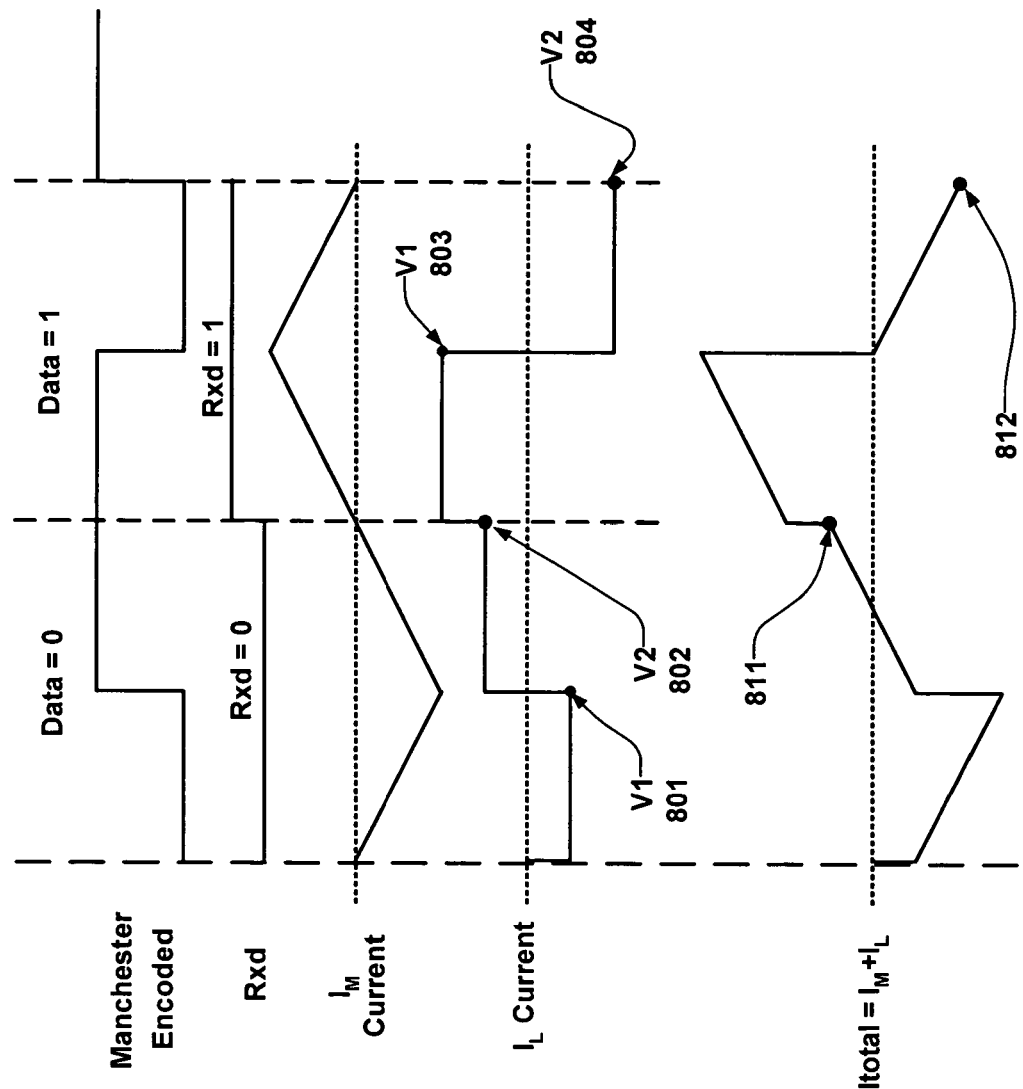
FIG. 8 is a signal diagram illustrating an example of transformer current waveforms associated with transmit and receive data signals, in accordance with an embodiment of the present invention.

The digital input voltage signal comprises short spans of relatively constant voltage values, balanced around zero. Due to the integral relationship between input voltage and current in an inductor, the magnetizing inductance current, as illustrated in FIG. 8, may be characterized as a fixed-rate ramp toggling between upward and downward slopes as the input voltage signal toggles between digital (e.g., binary) voltage states. A compensating current equivalent to the magnetizing current may therefore be generated by a controllable current ramp generator.

In one embodiment, a high speed ramp current is generated in block 622, and scaled and converted to Ixid in current driver block 624. The generated current, Ixid, feeds into the primary terminal of the transformer to cancel the magnetizing inductance current drawn by the transformer. Due to the operation of the feedback loop, current Ixid is adapted to be substantially equivalent to the magnetizing current, $I_M$, so that the current (Ixvd) sourced (or sunk) by voltage generator 626 is substantially equivalent to the isolated load current, $I_L$.

As illustrated, Receive Detector 618 decodes the receive data and generates the loop error discriminant from signal VMR. Signal VMR, in one embodiment, is a voltage signal that is generated by forcing the rectified value of current Ixvd (i.e., | Ixvd |) of the voltage driver thru a diode connected PMOS device. VMR can then be conveniently used in a current mirror configuration to regenerate error current within Error Integrator 620 for further processing.

The receive detector may comprise a load current processing circuit and a threshold detector, for example. Thus, an embodiment may use a simple logic of setting the receive data to zero ("0") when the load current is below the known threshold, otherwise the receive data is set to one ("1"). Alternately, the receive data may be differentially encoded such that the data may be detected by detecting the load currents differentially. Preferably, the ratio of the magnetizing inductance over the voltage driver source impedance (e.g. time constant) is much greater than the bit period to prevent decay of the signal during each sample period.

Example input voltage waveforms for transmit data (Manchester encoded), and corresponding waveforms for currents $I_M$, $I_L$ and Itotal are shown in FIG. 8. VMR can be sampled at two different times to form an error discriminant. Since $I_M$ is known to be ideally zero at the end of the Manchester period (V2—802, 804 in FIG. 8) and at its maximum in the middle of the Manchester period (V1—801, 803 in FIG. 8), VMR (that represents | Ixvd |) is sampled at those two instances, in one embodiment. Any difference that exists between the two samples represents a portion of magnetizing current $I_M$ that is not cancelled by the Ixid of the current driver 624, resulting in an error signal around which the servo loop may be closed to achieve Ixvd=$I_L$.

When the error signal into integrator 620 averages to zero, the integrator output is constant. This constant output forms the input basis for ramp generator 622. For instance, a constant current source, when integrated, results in a ramped current output. The generated current ramp from Ramp generator 622 may subsequently feed into Current Driver 624 (e.g., a high impedance driver), which drives the current, Ixid, into the primary of the transformer.

Thus, a feedback loop comprising an error (receive) detector 618, error integrator 620, ramp generator 622, and current driver 624 is used, in one embodiment, for cancellation of the magnetizing inductance current, $I_M$. The voltage driver sources (or sinks) the isolated load current equivalent.

Referring to FIG. 8, the receive signal Rxd may be decoded by sampling the current Ixvd (via sensing voltage VMR) at any time in the bit period, and comparing the magnitude of the sensed value against a threshold. The threshold may be derived, for example, from the average of the two sensed levels corresponding to the two known impedance values. Alternately, given that $I_L$ is substantially constant throughout each of the Manchester periods, $I_L$ can be integrated over the entire Manchester period to form a basis for receive detection.

After decoding, the receive signal RBS is separated (e.g. demultiplexed) into data and status information in Demux 614. The data portion may comprise six bits, for example, which may subsequently be serialized into the receive bit stream, RxdBS. In addition, the status bit STA may be used to form an 8-bit wide status word.

Line Side Barrier Interface

Figure 10:
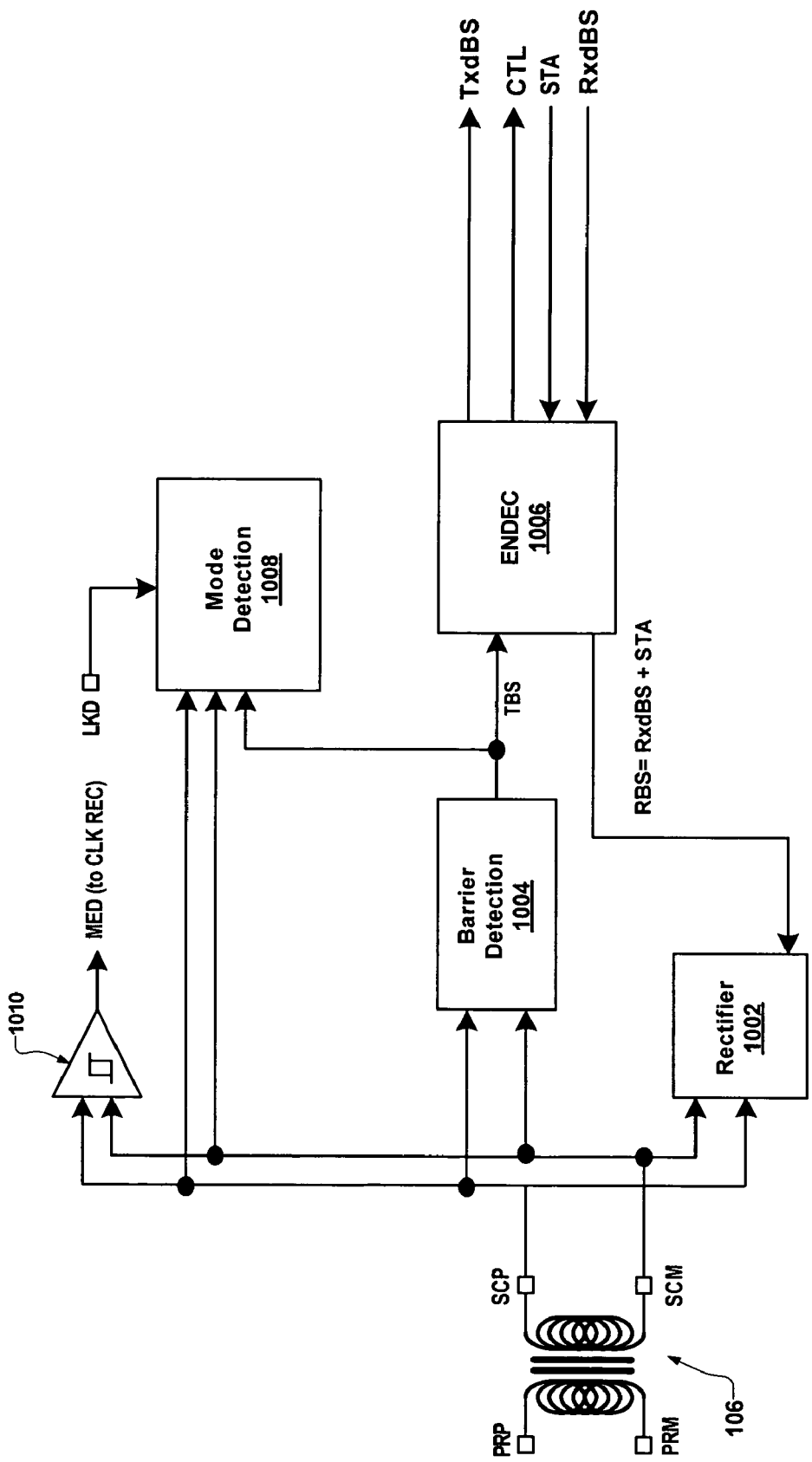
FIG. 10 is a block diagram of a line-side barrier interface in accordance with an embodiment of the present invention.

FIG. 10 is a functional illustration of an embodiment of a Line Side Barrier Interface (LSBI) 902. As illustrated, LSBI 902 comprises Rectifier 1002; Barrier Detection 1004; Encoder/Decoder (ENDEC) 1006; Mode Detection 1008; and amplifier/comparator 1010. Comparator 1010 generates and sends the transmitted Manchester Encoded Data (MED) to the clock recovery loop. MED may be raw data from the barrier or processed data to ease the task of clock recovery, depending on the state of the clock recovery loop.

In one embodiment, the barrier transformer 106 and the rectification scheme in Rectifier 1002 are such that 3V pulses from the HIC 104 will become 6V pulses to the LIC 108. The 6V pulses are rectified by the Rectifier 1002, which could be a diode bridge or any other rectification scheme (e.g. active or passive), on pins SCP and SCM of the transformer 106 to generate a positive supply voltage, VPX, for the LIC 108.

Barrier Detection 1004 performs raw data detection from the signal at the terminals, SCP and SCM, of the transformer.

In one embodiment, LSBI 902 identifies the state of operation by monitoring the transmit data stream, TBS, coming across the barrier from HIC 104 by checking the number of power pulses and the data pulses or by checking voltage levels of the transmit data stream (e.g., power pulses may be transmitted with a higher voltage than data pulses). For instance, the modes of operation may comprise a mixed mode and a data mode.

In Mixed mode, power transmission and full-duplex data transfer may be time division multiplexed. From reset until the assertion of an Off Hook command, HIC 104 may operate in a "Mixed Mode". During the Mixed mode, the HIC 104 may supply power to LIC 108 across the pulse transformer barrier. In some embodiments, HIC 104 may continue to deliver power to LIC 108 even after the off hook command is asserted.

In Data mode, transmit and receive data may be simultaneously and continuously exchanged between the LIC 108 and HIC 104 at twice the rate of Mixed mode as the power frames can now be used as data frames.

Encoder/Decoder (ENDEC) 1006 performs decoding of the transmit bit stream (TBS) into CTL and TxdBS and performs the reverse of DC Balance Coding performed in 604. That is, the ENDEC 1006 recovers TxdBS (see FIG. 6) on the line side.

Clock Recovery

One factor facilitating bi-directional communication across the barrier is having both the HIC and the LIC locked in time (synchronized). For example, switch RBS 302 in FIG. 3A is preferably opened and closed at the beginning or the end of the Manchester period. In other words Manchester edges in HIC should line up closely with those of the LIC. More accurate synchronization will result in better communication performance across the barrier.

Generation of Cancellation Current with High Speed Ramp Generators to Cancel Magnetizing Inductance Current One embodiment of the invention relates to a physical implementation that models a magnetization current as demanded by the primary of the isolation transformer when the transmit signal is doubly DC-balanced.

Figure 11:
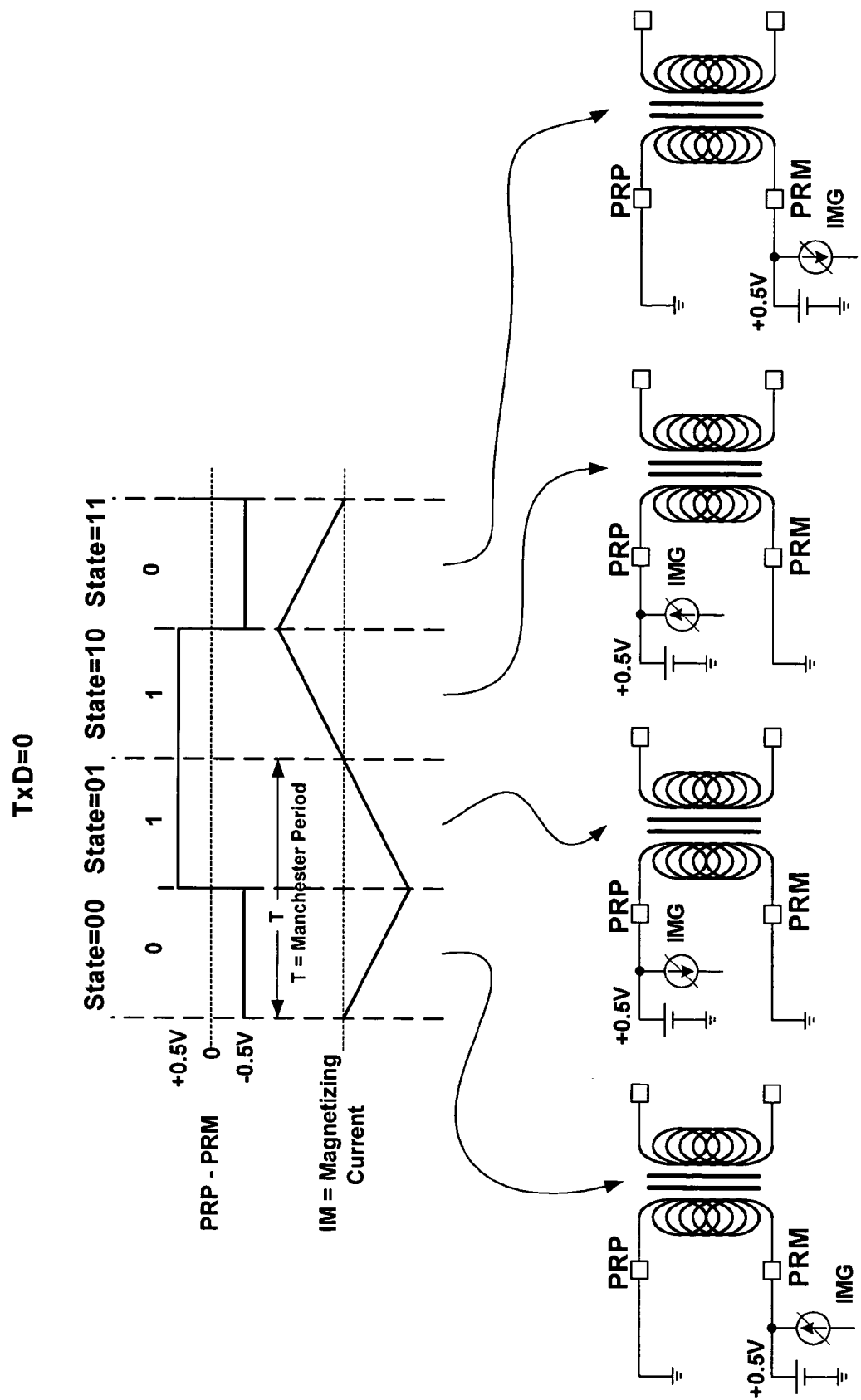
FIG. 11 is a simplified circuit model of the voltage drive and the associated magnetizing current demanded by the primary of the transformer.

The magnetization current demanded by the primary of the isolation transformer is ideally zero at the beginning and end of Manchester period when the transmit data is doubly DC-balanced. FIG. 11 illustrates the magnetization current that is demanded by the primary, and as supplied by the transmit current driver (624), when TxD=0 is shown doubly DC-balanced as "0110". Since the voltage driver 626 necessarily drives one of the primary terminals to a voltage source (e.g., +0.5v) and the other to zero (ground), the canceling magnetization current is applied to the terminal that the voltage driver is forcing the voltage (+0.5v) so as to relieve the voltage driver from having to supply the magnetization current.

FIG. 11 shows four possible configurations of how the magnetization current can be supplied to the primary of the transformer. In the example shown in FIG. 11, during the first (second) Manchester period, first the voltage is forced to PRM (PRP) with PRP (PRM)=0. Then, at the midpoint of the Manchester period, the voltage drive is switched to PRP (PRM) with PRM (PRP)=0. In the meantime, the canceling magnetization current, IMG, is forced into/out of the terminal of the primary that is being driven by the voltage source. These four possible conditions are labeled as States (00, 01, 10, 11), with State 00 (10) followed by State 01 (11).

1) State 00: PRP-PRM=−0.5V at the beginning of a Manchester period; The transmit voltage drive forces PRP=0V, PRM=+0.5V and IMG is forced into PRM.

2) State 01: PRP-PRM=+0.5V at the mid-point of a Manchester period; The transmit voltage drive forces PRP=+0.5V, PRM=0V and IMG is forced out of PRP.

3) State 10: PRP-PRM=+0.5V at the beginning of a Manchester period; The transmit voltage drive forces PRP=+0.5V, PRM=0V and IMG is forced into PRM.

4) State 11: PRP-PRM=−0.5V at the mid-point of a Manchester period; The transmit voltage drive forces PRM=0V, PRM=+0.5V and IMG is forced out of PRM.

IMG is a ramping current source that is ideally matched to the magnetization current, IM, as demanded by the primary. The magnitude of ramp current may be ramping up (as in States 00, 10) or down (as in States 01, 11). In the illustrated model, the voltage driver switches the terminal that it drives at mid-point of the Manchester period while the other side is grounded, i.e., driven to 0V. Thus, the terminal to which the cancellation current is applied switches as well at the mid-point of the Manchester period.

In order to optimize cancellation of the magnetizing current, the ramp generator preferably reacts precisely (i.e., with minimal delay) as the state transitions from one to the next.

Figure 12A:
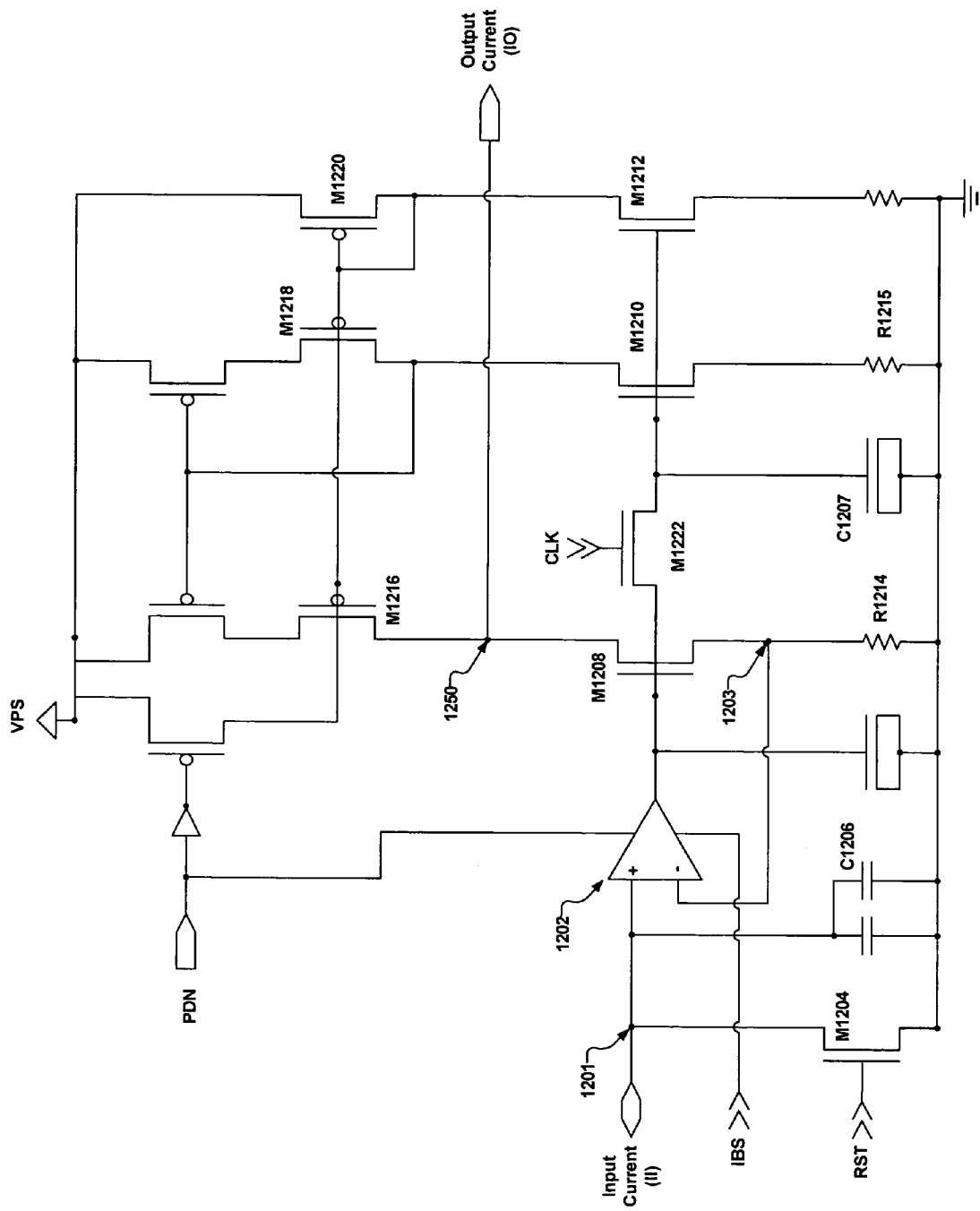
FIGS. 12A and 12B are circuit diagrams of example ramp generators in accordance with embodiments of the present invention.
Figure 12B:
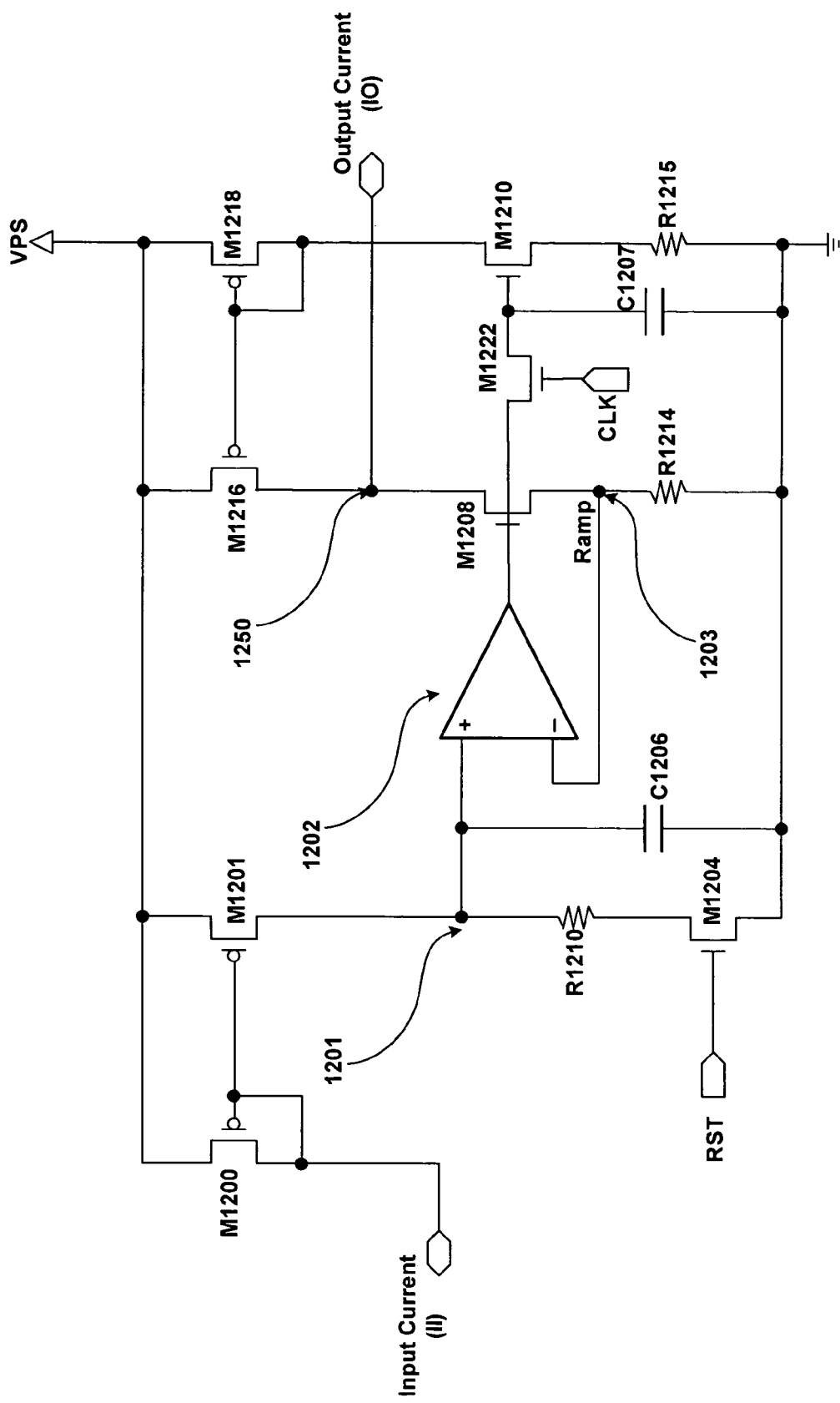

FIGS. 12A and 12B are sample embodiments of a high speed ramp generator in accordance with an embodiment of the present invention. The ramp generator circuit may be likened to the case of a race car waiting to start the race with both accelerator and brake pedals pressed together such that it can have a head start. That is, the force to go forward is exactly cancelled by the braking power applied to the car. When the pressure on the brake pedal is removed, the car moves forward quickly. With CLK=1, the switch M1222 is on and the current generated at the drain of M1208 is cancelled, to a first order, by the current which is the current thru M1208 mirrored back via M1210, M1218 and M1216 to the drain of M1208 such that output current; IO, is zero. When CLK=0, the opposing ramp current from M1216 is removed (e.g., locked to a constant current) and IO will begin to ramp with minimal delay. The signal RST is used to reset integration of input current. When RST="1", the node 1201 is held at a value roughly dictated by the input current and the resistor R1210.

The ramp generator receives a control input value II, which may be, for example, a slowly varying error discriminant from a feedback loop. As illustrated, the high speed ramp generator takes the relatively constant input current value, II, into node 1201 and imposes that signal onto capacitor C1206 when switch M1204 is turned off, i.e. when signal RST is false. Capacitor C1206 integrates the input current resulting in a ramping voltage at the positive input of amplifier 1202. The rate (i.e., slope) of the ramp is dependent on the magnitude of the input current II.

Operational amplifier 1202 performs a follower function onto resistor R1214. For instance, Operational Amplifier 1202 imposes the ramp voltage onto resistor R1214, resulting in a voltage to current translation out of the drain of device M1208 (which may be, but is not limited to a FET device, for example). The remainder of the circuit performs essentially a unity gain current mirror function. For instance, when switch M1222 is closed, i.e., CLK is high, the output current at node 1250 is cancelled out. However, when switch M1222 is open, i.e., CLK is low, the output current starts to ramp immediately.

In the circuits of FIGS. 12A and 12B, the current through M1208 is duplicated in M1210 and current-mirrored up via M1218 and M1216, and subtracted from the current through M1208. Thus, the output current IO will be ideally zero.

In operation, when switch M1222 is open, the gate of M1210 is held by capacitor C1207 with the voltage it had at the time switch M1222 opened. Thus, the mirrored current through M1216 is held constant resulting in nearly instantaneous net output current that is negative (i.e., sinks current from the output current port IO).

Figures 13, 14:
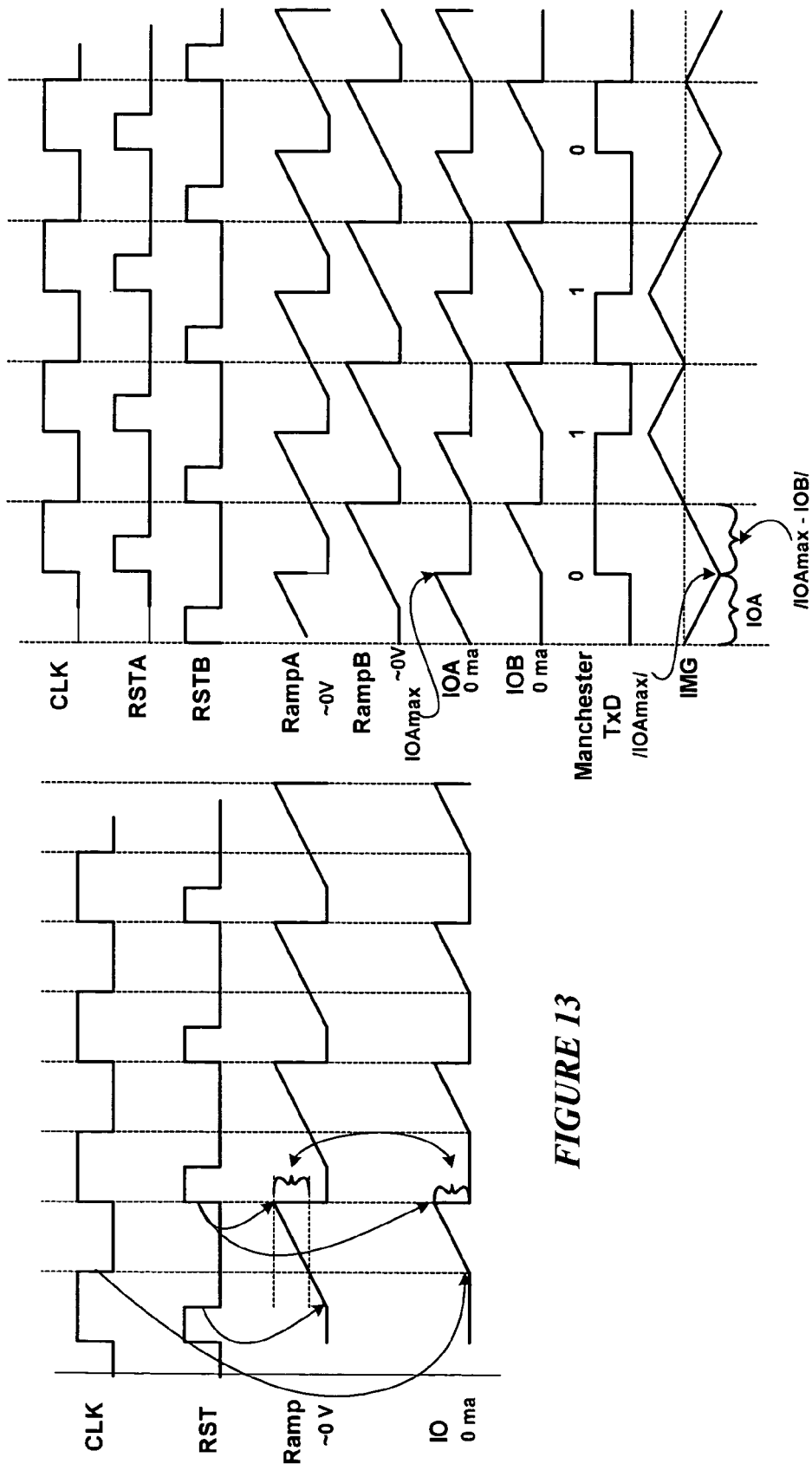
FIG. 13 is a timing diagram illustrating example signal waveforms in a ramp generator circuit in accordance with one or more embodiments of the invention.
FIG. 14 is a timing diagram illustrating the application of two ramp generators to provide a cancellation current signal in accordance with an embodiment of the present invention.

FIG. 13 is a timing diagram showing example waveforms associated with the circuit of FIG. 12B. When CLK="1" and RST="1", node N1201 is held at some convenient bias voltage which is approximately equal to the input current (II) multiplied by R1210. When RST is released (=0), the nodes 1201 and 1203 (Ramp) begin to ramp up. However, until CLK is released, the cancellation of current via M1210, M1218 and M1216 occurs such that the drain current of M1208 matches that of M1216 and the output current, IO, is zero. When CLK is released (=0), the drain current of M1216 ceases to follow that of M1208, and instead holds at a value that existed just at the time of release by the holding action of the capacitor C1207, and IO begins to ramp up. The rate of ramping is proportional to the magnitude of input current, II, and inversely proportional to the size of capacitor 1206. Thus, a change in the input current II induces a proportional change in the rate of ramping. The magnetization cancellation loop changes II until IMG closely matches $I_M$, the magnetizing current demanded by the primary of the transformer.

In accordance with one or more embodiments of the invention, there are two ramp generators used to carry out this cancellation scheme seamlessly. While one ramp generator is being used, say in State 00, there will be a second ramp generator being readied to provide a ramp current when State 01 starts. It is problematic to reuse the same ramp generator at the end of State 00, after it has peaked to its maximum value at PRM, and re-apply it to PRP and reverse its ramping direction without incurring delay or loss of timing accuracy. Accordingly, two ramp generators are involved: while the first ramp generator is being used for generating cancellation current, IMG, the second ramp generator is being readied, reset in its active mode with CLK=1. When the state changes, the second ramp generator is activated and the first one is reset and readied for the next state transition.

FIG. 14 shows resultant output currents, IOA and IOB, generated by two such ramp generators. The second ramp generator operates in a similar manner as the first one described in conjunction with FIGS. 12A and 12B with the role of CLK inverted. Thus two output currents, IOA and IOB, are accurately generated on opposite phases of CLK.

Figure 16:
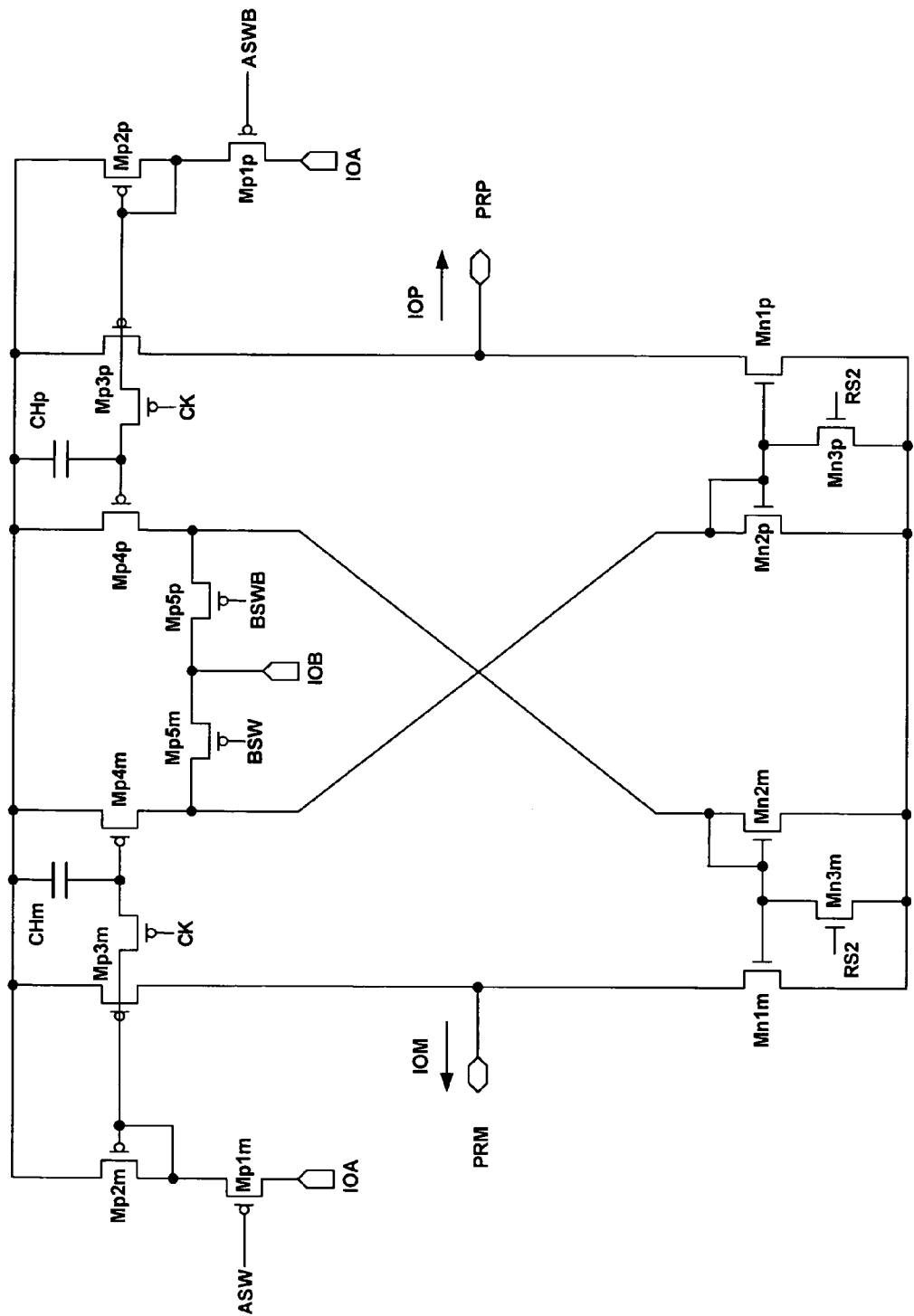
FIG. 16 is a circuit diagram of a current driver in accordance with one or more embodiments of the invention.

The generation of cancellation current for the second half of the Manchester period (into States 01 and 11) involves actually ramping down the current. This is accomplished by storing the current that has peaked at the mid-point of the Manchester period (IOAmax), as generated by the first ramp generator and as applied to one of the primary terminals. Both IOAmax and the output of the second ramp generator (IOB) are applied to the other terminal of the primary to subtract IOB from IOAmax with the net result being a ramp-down current. FIG. 14 also illustrates this subtraction process involved. (A simple circuit to effect this "traffic" control is shown in FIG. 16.)

Multiple high speed ramp generators may be used in an actual implementation to generate output currents of various characteristics. In such implementations, a common clock source, e.g. one used for data, may be used for all the ramp generators. For instance, in an embodiment comprising two ramp generators, the second ramp generator may be clocked with the inverse of the clock signal used to clock the first ramp generator. For example, since clock CLK is used at switch M1222 to generate a first ramp signal, the inverse of CLK may be used in a second ramp generator to generate a second ramp signal that may alternately be used during the period when the first ramp signal is being reset.

This implementation of a high speed ramp is advantageous over the prior art because it provides a substantially instantaneous (i.e., minimal onset delay) ramp response without the delay incident with a simple integrator approach. For instance, a simple operational amplifier feedback system integrator of the prior art may not be suitable for high speed applications such as those encountered in DAA type systems because of the delay incident with starting and stopping the integrator.

Figure 15:
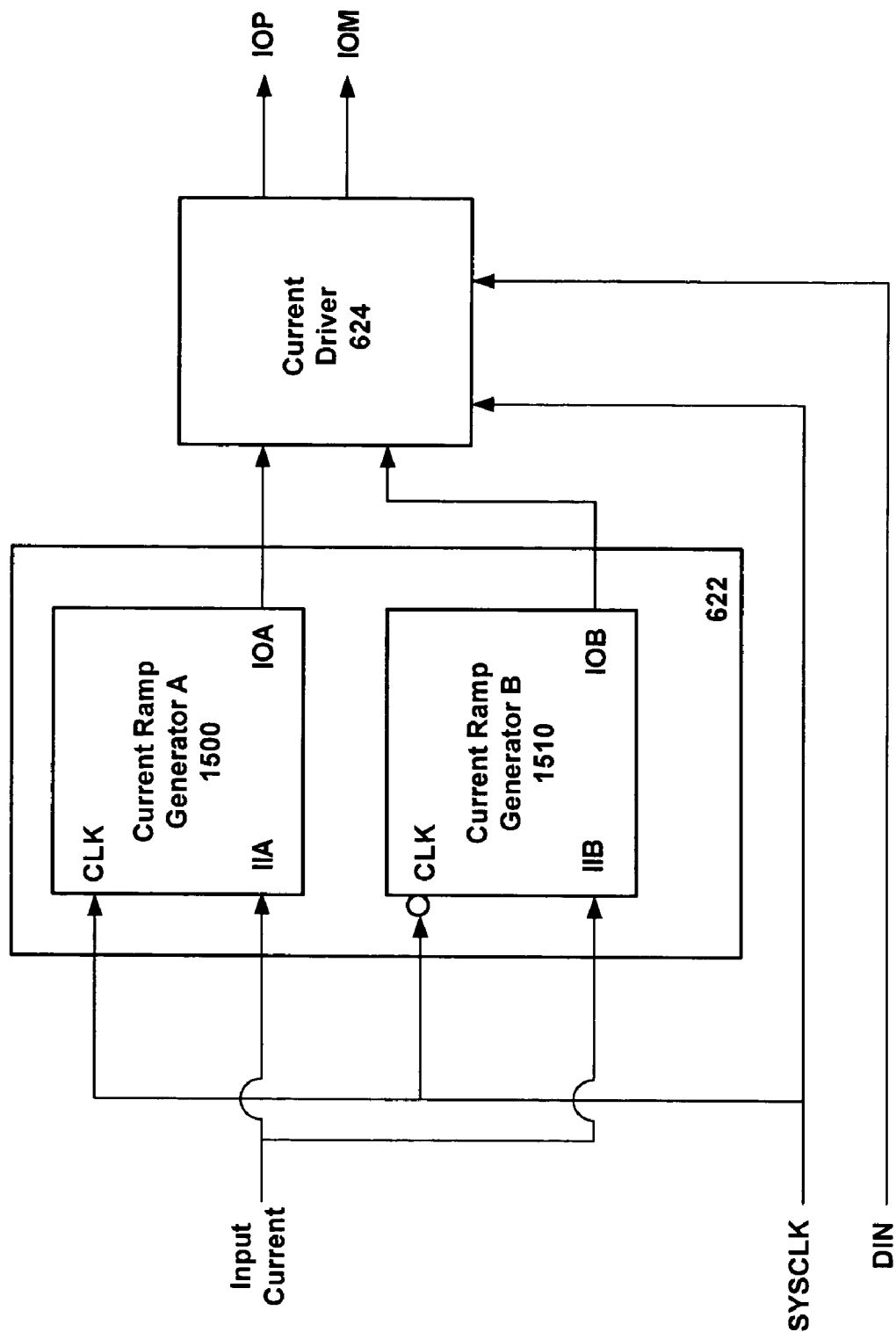
FIG. 15 is a block diagram illustrating a ramp generator/current driver configuration in accordance with an embodiment of the present invention.

A current driver and ramp generator configuration for a bi-directional DAA circuit may be configured as illustrated in FIG. 15. In this illustration, ramp generator 622 may be configured using two high speed ramp generators of the present invention. In the example embodiment shown, ramp generator 622 includes the dual current ramp generators 1500 and 1510. Current Ramp Generator A 1510 has as inputs, the system clock (SYSCLK) and the Input Current (II). Current Ramp Generator B 1510 has as inputs, the inverse of system clock and the Input Current. The inverse of the system clock may be generated such that there is no delay between the system clock and its inverse.

This dual current ramp generator configuration is configured such that ramp current output IOA is ramping while ramping current output IOB is fixed at zero, and vice versa. Each current ramp generator may be configured as illustrated in FIGS. 12A and 12B, for example. The resulting signals are as illustrated in the signal diagram of FIG. 14.

As illustrated in FIG. 14, signal IOA ramps up during times when the clock signal CLK is low, while signal IOB ramps up when the clock signal is high. Thus, while one of the two signals, IOA and IOB, is ramping up, the other is resetting. These two signals, IOA and IOB may be processed in block 624 to generate the equivalent magnetizing current shown in signal IMG for the positive terminal of the transformer. This may be accomplished by feeding additional signals such as the system clock and the transmit data, DIN, into block 624.

FIG. 16 illustrates one possible embodiment of the current driver circuit 624 in accordance with an embodiment of the invention. As shown, the output node of the first ramp generator (i.e., IOA) is coupled to switches Mp1$m$ and Mp1$p$ (e.g., coupled to the drain ports of FET transistors Mp1$m$ and Mp1$p$), which are controlled by signals ASW and ASWB, respectively. The output node of the second ramp generator (i.e., IOB) is coupled to switches Mp5$m$ and Mp5$p$, which are controlled by signals BSW and BSWB, respectively.

The second transmission port of switch Mp1$m$ is coupled to a current mirror circuit, including transistors Mp2$m$ and Mp3$m$, configured to source current to the negative output port IOM of the current driver (which corresponds to the negative port PRM of the transformer primary). A third transistor, Mp4$m$, is also configured to mirror the current through Mp2$m$; however, the gate of transistor Mp4$m$ includes a simple "track and hold" circuit including a switch controlled by the clock signal CK and a capacitor CHm.

Similarly, the second transmission port of switch Mp1$p$ is coupled to a current mirror circuit, including transistors Mp2$p$ and Mp3$p$, configured to source current to the positive output port IOP of the current driver (which corresponds to the positive port PRP of the transformer primary). Another transistor, Mp4$p$, is also configured to mirror the current through Mp2$p$; however, the gate of transistor Mp4$p$ includes a simple "track and hold" circuit including a switch controlled by the clock signal CK and a capacitor CHp.

The drain of transistor Mp4$m$ and the second transmission port of switch Mp5$m$ are commonly coupled to transistor Mn2$p$, which forms a current mirror circuit with transistor Mn1$p$ to sink current from the positive output port IOP. The gates of transistors Mn2$p$ and Mn1$p$ are coupled to a supply rail through switch Mn3$p$, to disable the current mirror when reset signal RS2 is asserted.

Likewise, the drain of transistor Mp4$p$ and the second transmission port of switch Mp5$p$ are commonly coupled to transistor Mn2$m$, which forms a current mirror circuit with transistor Mn1$m$ to sink current from the negative output port IOM. The gates of transistors Mn2$m$ and Mn1$m$ are coupled to a supply rail through switch Mn3$m$, to disable the current mirror when reset signal RS2 is asserted.

The behavior of the current driver of FIG. 16 is as follows, with reference to the timing diagram of FIG. 17. Manchester coded data (DIN) is delayed twice to yield signals ASW and BSW, which control the applied polarity of currents IOA and IOB by selected application to the positive and negative output ports, IOP and IOM. The storing of the peak ramp current (IOAmax) is provided by virtue of capacitors CHp and CHm in FIG. 16.

Figure 17:
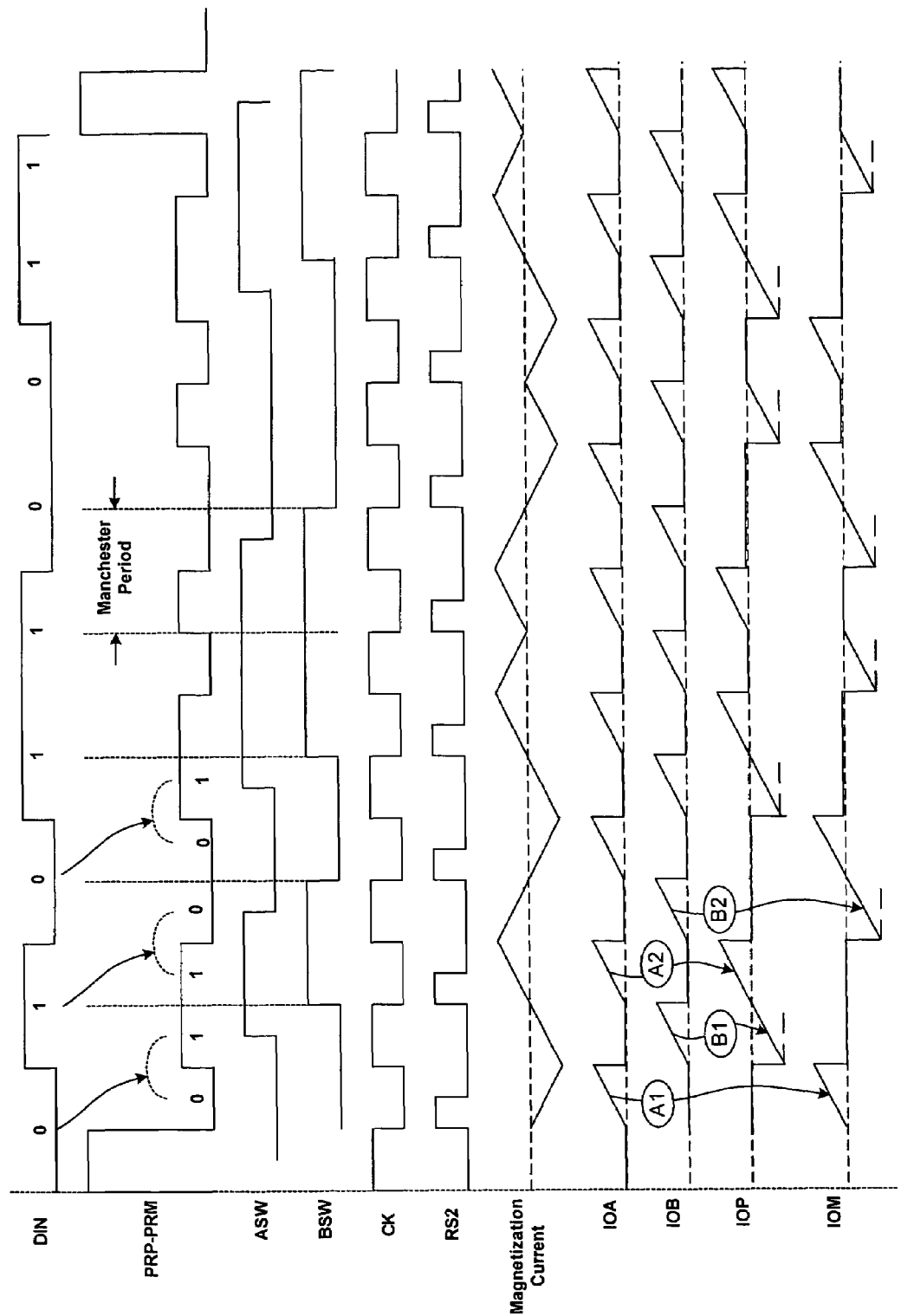
FIG. 17 is a timing diagram illustrating example signal waveforms associated with the current driver of FIG. 16, in accordance with one or more embodiments of the invention.

Referring to the first DIN value (=0), downward magnetization current is provided to the transformer during the first half of the Manchester period as shown in FIG. 17. IOA from the ramp generator is routed to IOM (PRM), referenced by label A1 in FIG. 17. (Note that at this time PRP (IOP) is grounded. Thus, instead of pulling the magnetization current out of PRP, it is forced into PRM (IOM).) The traffic control is such that IOA from the left hand side is mirrored via Mp2$m$ and Mp3$m$ to IOM (PRM). At the midpoint of the Manchester period, the ramp current (IOA) reaches it peak. This peak current value is maintained in transistor Mp4$m$ when the clock signal CK is high (i.e., the second half of the Manchester period) by switching off the common gate connection between Mp4$m$ and Mp3$m$ and storing the gate control voltage of transistor Mp4$m$ on capacitor CHm.

During the second half of the Manchester period, IOB from the second ramp generator is channeled through Mp5$m$ and subtracted from the peak current signal flowing through Mp4$m$. The current difference is mirrored via Mn2$p$ and Mn1$p$ to sink current from PRP (IOP), as represented by label B1. During this time, PRM is grounded. Initially, the peak current is drawn out of PRP, since IOB=0. As IOB builds up, less and less current is taken out of PRP. At the end of this period (i.e., the end of the first Manchester period), IOB reaches its peak value and the magnetization current to PRP will be zero, as illustrated in FIG. 17.

In a similar manner, for a DIN value of "1", the current signal IOA is channeled to IOP during the first half of the Manchester period (represented by label A2), and the current difference of IOAmax—IOB is channeled to IOM during the second half of the Manchester period (represented by label B2). The net current of IOP—IOM results in the precise application of the magnetization current needed by the transformer primary, such that the voltage driver need only provide the corresponding load current.

Thus, a high speed ramp generator has been described. Particular embodiments described herein are illustrative only and should not limit the present invention thereby. The invention is defined by the claims and their full scope of equivalents.

The invention claimed is:

1. A current ramp apparatus comprising:
   an integrator receiving an input signal and providing a first ramp current to an output node, said first ramp current having a ramp rate proportional to said input signal; and
   a current mirror circuit configured to provide a second current to said output node, said second current having an equivalent magnitude and opposite polarity of said first ramp current, said current mirror circuit configured to hold said second current at a constant value when a control signal is asserted.

2. The apparatus of claim 1, further comprising a reset circuit configured to reset said integrator.

3. The apparatus of claim 2, wherein said reset circuit is activated while said second current tracks said first ramp current.

4. The apparatus of claim 1, wherein said control signal is coupled to a clock signal.

5. The apparatus of claim 1, wherein said integrator comprises an operational amplifier coupled to a capacitor.

6. The apparatus claim 1, wherein said current mirror circuit comprises a switch and a capacitor coupled to a common gate node to selectably hold said constant current value.

7. A ramp generation method comprising:
integrating an input signal in an integrator to provide a first ramp current to a first output node, said first ramp current having a ramp rate proportional to said input signal;
providing an opposing current signal to said first output node from a current mirror circuit, said opposing current signal having an opposite polarity with respect to said first ramp current;
said opposing current signal tracking a magnitude of said first ramp current to provide a zero output current value from said first output node during a setup phase; and
providing a net ramp output current from said first output node by freezing said opposing current signal at a constant current value during a ramp phase.

8. The method of claim 7, further comprising:
resetting said integrator during said setup phase.

9. The method of claim 7, further comprising:
integrating said input signal in a second integrator to provide a second ramp current to a second output node;
providing a second opposing current signal to said second output node from a second current mirror circuit, said second opposing current signal having an opposite polarity with respect to said second ramp current;
said second opposing current signal tracking a magnitude of said second ramp current to provide a zero output current value from said second output node during said ramp phase; and
providing a second net ramp output current from said second output node by freezing said second opposing current signal during said setup phase.

10. The method of claim 9, further comprising:
maintaining a peak ramp current value obtained from said first output node during said ramp phase;
subtracting said second net ramp output current from said peak ramp current value during said setup phase to provide a return ramp signal that ramps from said peak ramp current value to zero.

11. The method of claim 10, further comprising:
selectively coupling said return ramp signal and said net ramp output current between a positive port and a negative port to control a ramp current polarity flowing between said positive port and said negative port.

12. A ramp signal apparatus comprising:
a first ramp generator configured to provide a first ramp current that ramps from zero to a peak ramp value during a first phase, said first ramp generator providing zero current during a second phase;
a second ramp generator configured to provide a second ramp current that ramps from zero to said peak ramp value during said second phase, said second ramp generator providing zero current during said first phase;
a current driver coupled to said first ramp generator and said second ramp generator, said current driver comprising:
a peak current track-and-hold circuit configured to track said peak ramp value from said first ramp current during said first phase and provide a constant peak current equivalent to said peak ramp value during said second phase;
a summing circuit configured to subtract said second ramp current from said constant peak current to provide a third ramp current that ramps from said peak ramp value to zero during said second phase.

13. The apparatus of claim 12, wherein said current driver further comprises:
a plurality of switches configured to channel said first ramp current and said third ramp current between a positive output port and a negative output port to control a polarity of a combined output ramp current.

14. The apparatus of claim 12, wherein said first ramp generator and said second ramp generator each comprise:
an integrator receiving an input signal and providing a main ramp current to an output node, said main ramp current having a ramp rate proportional to said input signal; and
a current mirror circuit configured to provide an opposing current to said output node, said opposing current having an equivalent magnitude and opposite polarity of said main ramp current, said current mirror circuit configured to hold said opposing current at a constant value when a control signal is asserted.

15. The apparatus of claim 14, wherein said integrator comprises a reset circuit configured to reset said integrator.

16. The apparatus of claim 15, wherein said reset circuit is activated while said opposing current tracks said main ramp current.

17. The apparatus of claim 14, wherein said control signal is coupled to a clock signal.

18. The apparatus of claim 14, wherein said integrator comprises an operational amplifier coupled to a capacitor.

19. The apparatus of claim 14, wherein said current mirror circuit comprises a switch and a capacitor coupled to a common gate node to selectably hold said constant value.

20. The apparatus of claim 14, wherein said control signal is asserted to trigger an immediate onset of a net ramp current at said output node.

* * * * *